(12) United States Patent
de Groot et al.

(10) Patent No.: US 7,826,064 B2
(45) Date of Patent: Nov. 2, 2010

(54) INTERFEROMETER SYSTEM FOR MONITORING AN OBJECT

(75) Inventors: Peter de Groot, Middletown, CT (US); Leslie L. Deck, Middletown, CT (US); Carl Zanoni, Middlefield, CT (US)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 12/635,932

(22) Filed: Dec. 11, 2009

(65) Prior Publication Data

US 2010/0091296 A1    Apr. 15, 2010

Related U.S. Application Data

(63) Continuation of application No. 12/051,531, filed on Mar. 19, 2008, now Pat. No. 7,639,367, which is a continuation of application No. 11/656,597, filed on Jan. 23, 2007, now Pat. No. 7,636,166.

(60) Provisional application No. 60/761,314, filed on Jan. 23, 2006, provisional application No. 60/782,722, filed on Mar. 15, 2006, provisional application No. 60/841,442, filed on Aug. 31, 2006.

(51) Int. Cl.
*G01B 11/02* (2006.01)

(52) U.S. Cl. ...................................... 356/508

(58) Field of Classification Search ................ 356/477, 356/482, 500, 508
See application file for complete search history.

(56) References Cited

U.S. PATENT DOCUMENTS 4,699,513 A    10/1987    Brooks et al.

5,122,648 A    6/1992    Cohen et al.
5,202,939 A    4/1993    Belleville et al.

(Continued)

OTHER PUBLICATIONS

U.S. Appl. No. 60/177,912, filed Jan. 2000, de Groot.

(Continued)

*Primary Examiner*—Gregory J Toatley
*Assistant Examiner*—Scott M Richey
(74) *Attorney, Agent, or Firm*—Fish & Richardson P.C.

(57) ABSTRACT

System for monitoring a position of one or more optical elements in a projection objective (PO) include a plurality of sensors each configured to receive input light and to form output light, each sensor including a first sensor optic and a second sensor optic, the first sensor optic of at least one of the sensors being affixed to a first PO optical element and the second sensor optic of the at least one sensor being affixed to a support element that positions the first PO optical element within the PO, the first and second sensor optics being configured introduce a first optical path length difference (OPD) between two components of the input light to form the output light, the first OPD being related to the position of the first PO optical element with respect to the support element. The systems also include a plurality of detectors configured to detect the output light from the sensors, a plurality of optical fibers configured to direct the input light to the sensors and to direct the output light from the sensors to the detectors, and an electronic controller in communication with the plurality of detectors, the electronic controller being configured to determine information about the position of the first PO optical element relative to the support element based on the detected output light from the at least one sensor.

28 Claims, 26 Drawing Sheets

U.S. PATENT DOCUMENTS

| | | | |
|---|---|---|---|
| 5,371,588 | A | 12/1994 | Davis et al. |
| 5,539,517 | A | 7/1996 | Cabib et al. |
| 5,541,730 | A * | 7/1996 | Chaney ............... 356/482 |
| 5,596,409 | A | 1/1997 | Marcus et al. |
| 5,659,392 | A | 8/1997 | Marcus et al. |
| 5,898,501 | A | 4/1999 | Suzuki et al. |
| 6,034,774 | A | 3/2000 | Marcus et al. |
| 6,038,027 | A | 3/2000 | Marcus et al. |
| 6,067,161 | A | 5/2000 | Marcus et al. |
| 6,075,601 | A * | 6/2000 | Marcus et al. ............. 356/497 |
| 6,082,892 | A * | 7/2000 | Adel et al. ............. 374/123 |
| 6,175,669 | B1 | 1/2001 | Colston et al. |
| 6,181,420 | B1 | 1/2001 | Badami et al. |
| 6,181,430 | B1 * | 1/2001 | Meyer et al. ............. 356/495 |
| 6,359,692 | B1 | 3/2002 | de Groot |
| 6,370,299 | B1 | 4/2002 | Green et al. |
| 6,490,046 | B1 * | 12/2002 | Drabarek et al. ............. 356/489 |
| 6,538,746 | B1 * | 3/2003 | Handrich ............. 356/482 |
| 6,545,761 | B1 | 4/2003 | Aziz et al. |
| 6,721,510 | B2 | 4/2004 | Graves et al. |
| 6,741,355 | B2 * | 5/2004 | Drabarek ............. 356/479 |
| 6,816,264 | B1 | 11/2004 | Dobbs |
| 6,822,745 | B2 | 11/2004 | de Groot et al. |
| 6,842,254 | B2 | 1/2005 | Van Neste |
| 6,847,453 | B2 * | 1/2005 | Bush ............. 356/479 |
| 6,901,176 | B2 | 5/2005 | Balachandran et al. |
| 6,977,730 | B2 | 12/2005 | Evans |
| 7,012,700 | B2 | 3/2006 | de Groot et al. |
| 7,046,371 | B2 | 5/2006 | de Lega et al. |
| 7,167,251 | B1 * | 1/2007 | Ulrich et al. ............. 356/512 |
| 7,187,453 | B2 | 3/2007 | Belleville |
| 7,206,076 | B2 * | 4/2007 | Blalock ............. 356/503 |
| 7,355,684 | B2 * | 4/2008 | Jeffers et al. ............. 356/35.5 |
| 7,372,575 | B2 | 5/2008 | Fujita |
| 7,417,740 | B2 * | 8/2008 | Alphonse et al. ............. 356/497 |
| 7,417,743 | B2 | 8/2008 | de Groot |
| 7,428,052 | B2 | 9/2008 | Fujita |
| 7,446,881 | B2 * | 11/2008 | Suzuki et al. ............. 356/497 |
| 7,477,399 | B2 * | 1/2009 | Takahashi ............. 356/497 |
| 7,488,929 | B2 | 2/2009 | Townley-Smith et al. |
| 7,492,468 | B2 * | 2/2009 | Henselmans et al. ......... 356/511 |
| 7,492,469 | B2 | 2/2009 | de Groot |
| 7,636,166 | B2 * | 12/2009 | De Groot et al. ............. 356/500 |
| 7,639,367 | B2 * | 12/2009 | Groot et al. ............. 356/497 |
| 2002/0085208 | A1 | 7/2002 | Hauger et al. |
| 2002/0196450 | A1 | 12/2002 | Olszak et al. |
| 2003/0223079 | A1 | 12/2003 | Hill |
| 2005/0157306 | A1 | 7/2005 | Schmit et al. |
| 2005/0232531 | A1 | 10/2005 | Hadley et al. |
| 2006/0103850 | A1 | 5/2006 | Alphonse et al. |
| 2007/0127034 | A1 * | 6/2007 | Koshimizu et al. ........... 356/498 |
| 2009/0231594 | A1 * | 9/2009 | Harris ............. 356/500 |
| 2010/0097617 | A1 * | 4/2010 | Tobiason ............. 356/482 |

OTHER PUBLICATIONS de Groot, Peter et al., "Laser Gage Using Chirped Synthetic Wavelength Interferometry," Proceedings of SPIE 1821-12:1-10 (1993)

Lay, O.P. et al., "Coherent Range-Gated Laser Displacement Metrology with Compact Optical Head," Optics Letters 32:2933-2935 (2007).

M. Marcus, "Fiber optics interferometry for industrial process monitoring and control applications," Proc. SPIE, vol. 4578, pp. 136-144 (2002).

Weng, Jidong et al., "A Compact All-Fiber Displacement Interferometer for Measuring the Foil Velocity Diven by Laser," Review of Scientific Instruments 79:113101-11303 (2008).

International Search Report based on PCT/US07/01772, dated May 1, 2008.

Saxer, Christopher E., et al., "High-speed fiber-based polarization-sensitive optical coherence tomography of in vivo human skin", Optics Letters, vol. 25, No. 18, pp. 1355-1357 (Sep. 15, 2000).

Wang, Anbo et al., "Self-Calibrated interferometric-Intensity-Based Optical Fiber Sensors", Journal of Lightwave Technology, vol. 19, No. 10, pp. 1495-1501 (Oct. 10, 2001).

International Search Report and Written Opinion dated Jun. 29, 2010, corresponding to Int'l. Appln. No. PCT/US2009/065572.

International Search Report and Written Opinion dated Jun. 30, 2010, corresponding to Int'l. Appln. No. PCT/US2009/065529.

\* cited by examiner

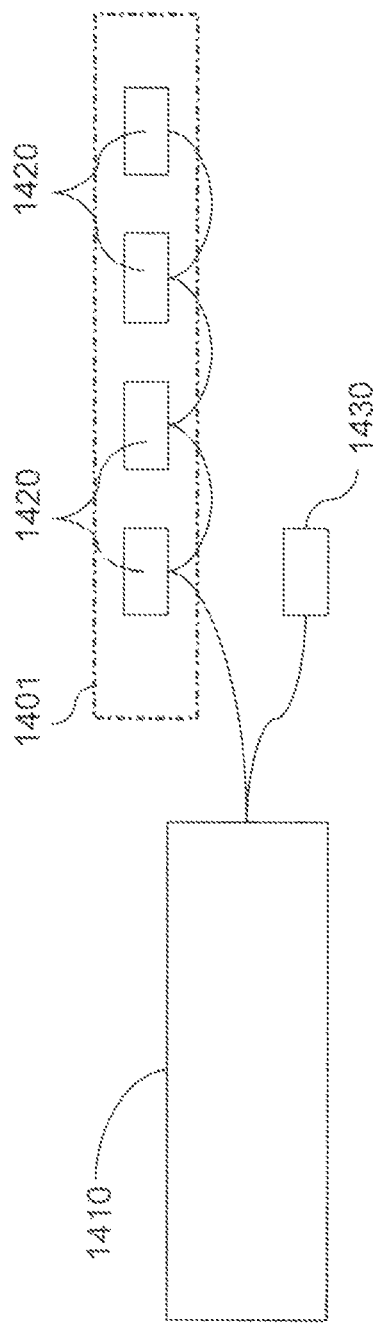
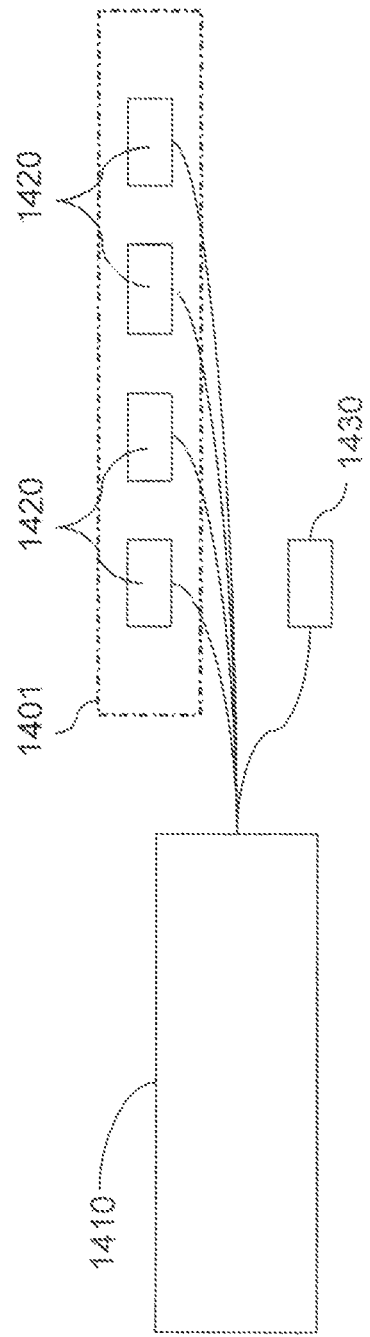
FIG. 14A
FIG. 14B

INTERFEROMETER SYSTEM FOR MONITORING AN OBJECT

CROSS-REFERENCE TO RELATED APPLICATIONS

This application is a continuation of U.S. patent application Ser. No. 12/051,531, filed on Mar. 19, 2008, which is a continuation of U.S. patent application Ser. No. 11/656,597, filed on Jan. 23, 2007, which claims priority to the following Provisional Patent Applications: Application No. 60/761,314, entitled "FIBER SENSOR SYSTEM FOR MONITORING POSITION AND ORIENTATION OF AN OBJECT," filed on Jan. 23, 2006; Application No. 60/782,722, entitled "FIBER SENSOR SYSTEM FOR MONITORING POSITION AND ORIENTATION OF AN OBJECT," filed on Mar. 15, 2006; and Application No. 60/841,442, entitled "FIBER SENSOR SYSTEM FOR MONITORING POSITION AND ORIENTATION OF AN OBJECT," filed on Aug. 31, 2006. The entire contents of each of these applications is incorporated herein by reference.

BACKGROUND

For many precision engineering systems, it is required to measure the position of an object to nm-level tolerances over long periods of time, e.g., days, months, or even years. The range of motion of the object may be small, e.g., less than a mm in any direction, but should be controlled with an active servo loop for stability and to provide for fine, controlled adjustments.

An example of such a precision engineering system is the projection objective (PO) assembly of a modern photolithography tool. Examples of PO assemblies are described in *Microlithography: Science and Technology*, edited by J. R. Sheats and B. W. Smith, Marcel Decker, Inc. (New York, N.Y. 1998). PO assemblies include dioptric PO assemblies, catadioptric PO assemblies, and catoptric PO assemblies.

In such PO assemblies, various subassemblies comprised of lenses are held in relationship to each other and/or in relation to a PO assembly lens cell by means of small actuators that operate in conjunction with sensors placed throughout the PO assembly which is comprised of the lens elements and the cell to measure relative positions. These sensors may be, for example, encoder devices as described by A. H. Slocum in *Precision Machine Design*, Englewood Cliffs, N.J.: Prentice Hall, pp. 162-173. (1992), and are used for position feedback control.

SUMMARY

The disclosure features sensors and sensor systems for monitoring the position of one component with respect to another component, such as the position of an optical component relative to a mounting frame or another optical component. The sensor systems measure at least one degree of freedom of one or more components by means of multiple passive, interferometric optical sensor. In general, each sensor is sensitive to one degree of freedom and substantially insensitive to the other degrees of freedom. Each optical sensor is illuminated by light from at least one fiber waveguide, such as an optical fiber, and the optical signals from the sensors are transmitted to a remote common light source/detector subsystem by at least one fiber waveguide. The light source/detector subsystem can provide a single source of light to all the optical sensors. The light may be either wavelength tunable or a multiplexed series of discrete wavelengths or both.

In certain embodiments, the light source/detector unit can have two operational modes. In one mode, the light source/detector unit establishes an absolute home position for the sensor to determine an absolute position as may be required from time to time. In a second mode, the light source/detector unit measures any changes in the objects degree of freedom at high speed, e.g., 1 kHz, so as to provide continuous data to a position control servo system. Means for athermalization of the sensor are also provided.

In some embodiments, sensors provide continuous, high-speed absolute distance measurements without the need to switch operational modes.

Several types of sensor, light sensor/detector unit, and fiber optic architectures can be used.

In general, in a first aspect, the invention features a system that includes a first object mounted relative to a second object, the first object being moveable with respect to the second object. The system includes a plurality of interferometers each configured to derive a first wavefront and a second wavefront from input radiation and to combine the first and second wavefronts to provide output radiation including information about an optical path length difference between the paths of the first and second wavefronts, each interferometer including a reflective element positioned in the path of the first wavefront, and at least one of the interferometer's reflective element is mounted on the first object. The system also includes a plurality of fiber waveguides and an electronic controller. Each fiber waveguide is configured to deliver the input radiation to a corresponding interferometer or deliver the output radiation from the corresponding interferometer to a corresponding detector. The electronic controller is configured to monitor a degree of freedom of the first object relative to the second object based on the information from at least one of the interferometers, wherein the degree of freedom is an absolute displacement between the first and second objects.

Embodiments of the system can include one or more of the following features and/or features of other aspects. For example, in some embodiments, each fiber waveguide is configured to deliver the input radiation to the corresponding interferometer and deliver the output radiation from the corresponding interferometer to the corresponding detector. The input radiation for each interferometer can have a wavelength in a range from about 900 nm to about 1,600 nm (e.g., from about 1,500 nm to about 1,600 nm). The input radiation for each interferometer can have a different wavelength than for the other interferometers.

Each interferometer can include an optical interface positioned in a path of the input radiation, where the optical interface is configured to reflect a first portion of the input radiation to form either the first or second wavefronts. The optical interface can be a surface of a fiber waveguide. The optical interface can be a planar optical interface. The optical interface can be a surface of a transparent element. The surface can be configured to transmit a second portion of the input radiation to form either the second or first wavefronts. In some embodiments, each interferometer includes a beam splitter configured to split the input radiation into the measurement and reference wavefronts. Each beam splitter can be a polarizing beam splitter or a non-polarizing beam splitter.

Each interferometer can be configured so that the first wavefront reflects from the object once or more than once.

Each reflective element can be a retroreflector or a mirror.

For at least one of the interferometers the first wavefront can reflect from the reflective element and the reflective element can include a surface configured to receive the first wavefront where the surface has a dimension that is smaller than a cross-sectional dimension of the first wavefront prior to reflecting from the reflective element. Alternatively, or additionally, for at least one of the interferometers the first wavefront can reflect from the reflective element and the reflective element can include a surface configured to receive the first wavefront where the surface has a dimension that is larger than a cross-sectional dimension of the first wavefront prior to reflecting from the reflective element.

In some embodiments, at least one of the interferometers further includes an optical element configured to shape input radiation emerging from the respective fiber waveguide. The optical element can be a lens. The lens can be configured to collimate input radiation emerging from the respective optical fiber. The lens can include a surface that reflects the first or second wavefront.

For at least one of the interferometers the first or second wavefront can have a diameter of about 0.2 mm or less at the first object. The lens can be configured to focus light emerging from the optical fiber. The reflective element can be positioned at or near the waist of the focused light.

The system can include a light source configured to produce the input radiation, the system being configured to deliver the input radiation to the interferometers via the plurality of fiber waveguides. The light source can include a broadband light source. In some embodiments, the system includes a plurality of optical filters configured to transmit input radiation of differing wavelengths from the broadband light source to the interferometers. Each optical filter can correspond to one of the plurality of interferometers. The broadband light source can be a light emitting diode or an amplified spontaneous emission source. The light source can include a laser, such as a distributed feedback laser. The system can include an amplifier configured to amplify radiation from the light source and direct the amplified radiation to the interferometers. The light source can include a plurality of light source elements, each element being configured to produce radiation at a different wavelength.

The system can include additional fiber waveguides, where the plurality of fiber waveguides and additional fiber waveguides form a fiber network configured to deliver the input radiation to the interferometers and to deliver the output radiation from the interferometers to the detectors.

In some embodiments, the system includes a remote optical cavity optically coupled to the interferometers. The remote optical cavity can include a first optical path and a second optical path and further comprises an element configured to vary an optical path different between first and second optical paths.

The first object can be an optical component and the second object is a frame in which the optical component is mounted. The first object can be an optical component in an optical imaging system. The optical imaging system can be a projection objective assembly of a microlithography tool or a telescope.

The system can include an actuator coupled to the first object, the actuator being in communication with the electronic controller and being configured to adjust the position of the first object based on the information determined by the electronic controller.

In general, in another aspect, the invention features a method of monitoring degree of freedom of a first object with respect to a second object. The method includes directing radiation from a light source to a plurality of interferometers, each interferometer being configured to receive the radiation from a fiber waveguide, to derive a first wavefront and a second wavefront from the radiation and to combine the first and second wavefronts to provide output radiation comprising information about an optical path length difference between the paths of the first and second wavefronts, wherein at least one of the interferometers is configured to direct the first wavefront to reflect from an element positioned on the first object. The method includes directing the output radiation from each interferometer to a respective detector and determining information about a degree of freedom of the first object relative to the second object based on the information from the output radiation from at least one of the interferometers, wherein the information includes an absolute displacement between the first and second objects.

Embodiments of the method can include one or more of the following features and/or features of other aspects. For example, the method can include determining information about two or more degrees of freedom of the first object based on information from the output radiation from two or more interferometers. The method can include determining information about a degree of freedom of the a third object relative to the first or second objects based on the information from the output radiation from at least one of the interferometers. The radiation directed to each interferometer can be directed through a common fiber waveguide. The information can include variations of a displacement between the first object and a second object.

The method can include adjusting the position of the first object based on the monitored degree of freedom. The method can include outputting information about the position of the first object based on the monitored degree of freedom. The method can include updating the information about the degree of freedom at a rate of about 5 kHz or more (e.g., about 10 kHz or more, about 100 kHz or more, about 500 kHz or more, about 1 MHz or more). The output radiation can be directed to the respective detector via the corresponding fiber waveguide. The information about the absolute displacement can be determined to an accuracy of 1 nm or better (e.g., 0.5 nm or better, 0.1 nm or better).

In general, in a further aspect, the invention features a system that includes a first object mounted relative to a second object, the first object being moveable with respect to the second object. The system includes a plurality of interferometers each configured to derive a first wavefront and a second wavefront from input radiation and to combine the first and second wavefronts to provide output radiation including information about an optical path length difference between the paths of the first and second wavefronts, each interferometer including a reflective element positioned in the path of the first wavefront, and at least one of the interferometer's reflective element is mounted on the first object. The system includes a plurality of fiber waveguides, each fiber waveguide being configured to deliver the input radiation to a corresponding interferometer and/or deliver the output radiation from the corresponding interferometer to a corresponding detector. The system includes an electronic controller configured to monitor a degree of freedom of the first object relative to the second object based on the information from at least one of the interferometers, wherein the first object is a refractive element or a reflective element of an optical imaging system. The optical imaging system can be a telescope or a projection objective of a microlithography tool. Embodiments can include one or more of the features of other aspects.

In general, in another aspect, the invention features a system that includes a first object mounted relative to a second object, the first object being moveable with respect to the second object. The system includes a low coherence light source configured to provide input radiation and a plurality of interferometers each configured to derive a first wavefront and a second wavefront from the input radiation and to combine the first and second wavefronts to provide output radiation including information about an optical path length difference between the paths of the first and second wavefronts, each interferometer including a reflective element positioned in the path of the first wavefront, and at least one of the interferometer's reflective element is mounted on the first object. The system also includes a plurality of fiber waveguides, each fiber waveguide being configured to deliver the input radiation to a corresponding interferometer and/or deliver the output radiation from the corresponding interferometer to a corresponding detector. The system includes an electronic controller configured to monitor a degree of freedom of the first object relative to the second object based on the information from at least one of the interferometers. The light source can have a coherence length of about 1 meter or less (e.g., about 1 cm or less, 1 mm or less, 0.5 mm or less). The source can be a broadband light source. Embodiments of the system can include features of other aspects.

In general, in another aspect, the invention features systems for monitoring the position of one or more components mounted in an assembly via a component frame. The system includes one or more passive interferometric sensors, each sensitive to only one degree of freedom of the component, each passive interferometric sensor being configured to derive a first beam and a second beam from an input beam, to direct the first or second beams to reflect from a first object, and to recombine the first and second beams to form an output beam comprising information about the optical path difference between the paths of the first and second beams, wherein the input beam is delivered to the sensors via fiber optic cable from an illumination assembly, the output beam is delivered to a detection assembly via the same or different fiber optic cable, and for each sensor, the first object or the passive interferometric sensor is attached to the component frame.

Embodiments of the system can include one or more of the following features and/or features of other aspects. For example, in some embodiments, the assembly is a projection objective assembly.

The illumination assembly can include a source configured to deliver the input beams to the passive interferometric sensors. The source can include a laser (e.g., a distributed feedback laser). The source can be a broadband source. The source can include a plurality of source elements each configured to produce light of a different wavelength. Each source element can include a laser. In some embodiments, the system includes a wave division multiplexer configured to receive light from the source elements and to couple the light into a waveguide arranged to deliver the light to the passive interferometric sensors.

The component can be located about 10 cm or less (e.g., about 1 cm or less) from the respective passive interferometric sensor.

Each passive interferometric sensor can include an optical interface positioned in a path of the input beam, where the optical interface is configured to reflect a first portion of the input beam to form either the first or second beams. The optical interface can be a surface of an optical fiber. The optical interface can be a planar optical interface. The optical interface can be a surface of a transparent element. The surface can be configured to transmit a second portion of the input beam to form either the second or first beams.

Each passive interferometric sensor can include a beam splitter configured to split the input beam into the measurement and reference beams. Each beam splitter can be a polarizing beam splitter.

Each passive interferometric sensor can be configured so that the first beam reflects from the object once. Alternatively, in some embodiments, each passive interferometric sensor is configured so that the first beam reflects from the object more than once.

Each first object can include a respective retroreflector and/or a mirror (e.g., a plane minor or a curved minor).

The system can include an optical element (e.g., a lens or lenses) configured to shape light emerging from the optical fiber. The optical element can be configured to collimate light emerging from the optical fiber. In some embodiments, the optical element is configured to focus light emerging from the optical fiber.

The detection assembly can include a detector configured to receive the output beam from the one or more passive interferometric sensors. The detector can be a single element detector. The detector can be located about 20 cm or more away from a corresponding first object. The detector can be located about 100 cm or more away from the corresponding first object. The detector can be positioned remote from the component. The system can also include an electronic processor coupled to the detector, the electronic processor being configured to determine information about the position of the object based on a signal from the detector in response to an output beam from one of the passive interferometric sensors. The system can include an actuator coupled to the component, the actuator being in communication with the electronic processor and being configured to adjust the position of the component based on the information determined by the electronic processor.

For each passive interferometric sensor, the first beam can be polarized or unpolarized.

The component can be a refractive component (e.g., a lens), a reflective component (e.g., a minor), or a diffractive component (e.g., a grating). The assembly can include additional components and the system is configured to monitor positions of the other components.

In another aspect, the invention features a photolithography tool include the foregoing system.

In general, in another aspect, the invention features systems that include a projection objective assembly comprising a plurality of optical elements mounted in a frame, a plurality of sensors, each arranged to direct light between one of the optical elements and the frame; and a plurality of detectors positioned at a location remote from the projection objective assembly, the detectors being configured to detect the light after it is directed by the sensors between the optical elements and the frame.

Embodiments of the system can include one or more of the following features and/or features of other aspects. For example, the system can include an optical fiber configured to direct light from at least one of the sensors to at least one of the detectors.

In general, in another aspect, the invention features systems that include an interferometer attached to a projection objective assembly, the projection objecting assembly comprising an optical component, a light source configured to direct light to the interferometer, and a detector configured to receive light from the interferometer. During operation, the interferometer receives input light from the light source and directs output light to the detector, the output light comprising information about a position of the optical component in the projection objective assembly. Embodiments of the system can include one or more of the features of other aspects.

In general, in another aspect, the invention features methods that include directing a first beam between a frame and an optical component in a projection objective assembly, the optical component being supported by the frame, combining the first beam with a second beam to form an output beam, directing the output beam to a detector positioned at a location remote from the projection objective assembly, and monitoring a position of the optical component based on a signal from the detector in response to the output beam. The method can be implemented using the systems of other aspects and can include features of the other aspects.

In general, in a further aspect, the invention features systems for monitoring the position of a component mounted in a projection objective assembly via a component frame. The systems include an interferometer configured to derive a first beam and a second beam from an input beam, to direct the first or second beams to reflect from a first object, and to recombine the first and second beams to form an output beam comprising information between an optical path difference between the paths of the first and second beams, wherein the first object or the interferometer is attached to the component frame.

Embodiments of the systems can include features of other aspects. In some embodiments, the systems include additional interferometers, each configured to derive a respective first beam and a respective second beam from a respective input beam, to direct the first or second respective beams to reflect from a respective first object, and to recombine the first and second respective beams to form a respective output beam comprising information between an optical path difference between the paths of the first and second respective beams, wherein for each interferometer the respective first object or the interferometer is attached to the component frame.

Among other advantages, embodiments include sensor systems for monitoring the position of optical components in a projection objective assembly where the portion(s) of the sensor system embedded in the a frame is relatively compact (e.g., components are on the order of a few square centimeters in size). Moreover, embodiments can be adapted to fit within a volume prescribed by the end-use application. For example, embodiments can be adapted to fit within a pre-designed frame of a larger system, allowing third-party manufacturers to utilize sensor systems with little or no redesign of their systems.

The measurement systems disclosed herein, some of which are based on a 3-wavelength coupled-cavity heterodyne technique, can provide absolute distance capability, completely passive sensor architecture, 0.1 nm resolution, high speed (>5 kHz), and can handle target velocities in excess of 20 mm/sec.

Embodiments include components developed for the telecom industry, and systems benefit from the inherent reliability of these components. Embodiments of the sensor itself has few components, is relatively insensitive to target motion along uninteresting degrees of freedom, is robust and tolerant of poor target quality, and is low cost in quantity. Further, in certain embodiments, more sensor channels are available than the number of sensors used, so the extra channels can be used for refractometer measurements.

In some embodiments, the sensor systems are extremely stable (e.g., the sensors consistently measure object positions to within a few nanometer accuracy over periods of months or years). In certain embodiments, the sensor systems are extremely reliable (e.g., the probability of system failure over the course of several years is very low, such as about 1% or less).

The sensor systems can be relatively efficient, using low power sources and dissipating little power at the optical sensor itself. Low power dissipation at the optical sensor can result in a system that causes very little thermal disruption of the system in which the sensor is mounted.

Sensor systems can include sensors that can be initialized to an absolute home position, allowing a user to monitor absolute distances.

Where they are used in PO assemblies (e.g.), the sensors can be easy to install in PO assemblies.

Sensors can be relatively insensitive to thermal variations. Sensors can contribute minimally to thermal variations in PO assembly assemblies.

All the active (e.g., components that include electrical circuitry) components of a sensor system can be located remotely from the PO assembly, resulting in reduced thermal variation at the PO assembly due to electrical circuit heating. In other words, the system can be configured so that only passive components are embedded with the PO assembly.

In certain implementations, the sensor systems use coherence scanning interferometry with a coupled cavity. Advantages of techniques that use coherence scanning interferometry with coupled cavity generally can include relatively low cost, short sensor gaps, small absolute gap uncertainties, high resolution, and average measurement rates.

In certain implementations, the sensor systems use coherence scanning interferometry with coupled cavity and heterodyne interferometry. Advantages of techniques that use coherence scanning interferometry with coupled cavity and heterodyne interferometry can include average cost, good component availability, short sensor gaps, small absolute gap uncertainties, high resolution, high measurement rates, and good data age estimation.

In certain implementations, the sensor systems use multi-wavelength interferometry with coupled cavity and heterodyne interferometry. Advantages of techniques that use multi-wavelength interferometry with coupled cavity and heterodyne interferometry can include low to average cost, good component availability, short sensor gaps, small absolute gap uncertainties, high resolution, high measurement rates, and good data age estimation.

In certain implementations, the sensor systems use multi-wavelength interferometry Advantages of techniques that use multi-wavelength interferometry can include good component availability, small sensor gaps, average absolute gap uncertainties, high measurement rates, and good data age estimation.

In certain implementations, the sensor systems use swept wavelength interferometry. Advantages of techniques that use swept wavelength interferometry can include average component availability, average absolute gap uncertainties, average resolution, high measurement rates, and good data age estimation.

A number of documents are incorporated herein by reference. In case of conflict, the current specification will control. The details of one or more embodiments are set forth in the accompanying drawings and the description below. Other features and advantages will be apparent from the description and drawings, and from the claims.

DESCRIPTION OF DRAWINGS

FIG. 14A is a schematic diagram of a sensor system.
FIG. 14B is a schematic diagram of a sensor system.

Like reference symbols in the various drawings indicate like elements.

DETAILED DESCRIPTION

Figure 1:
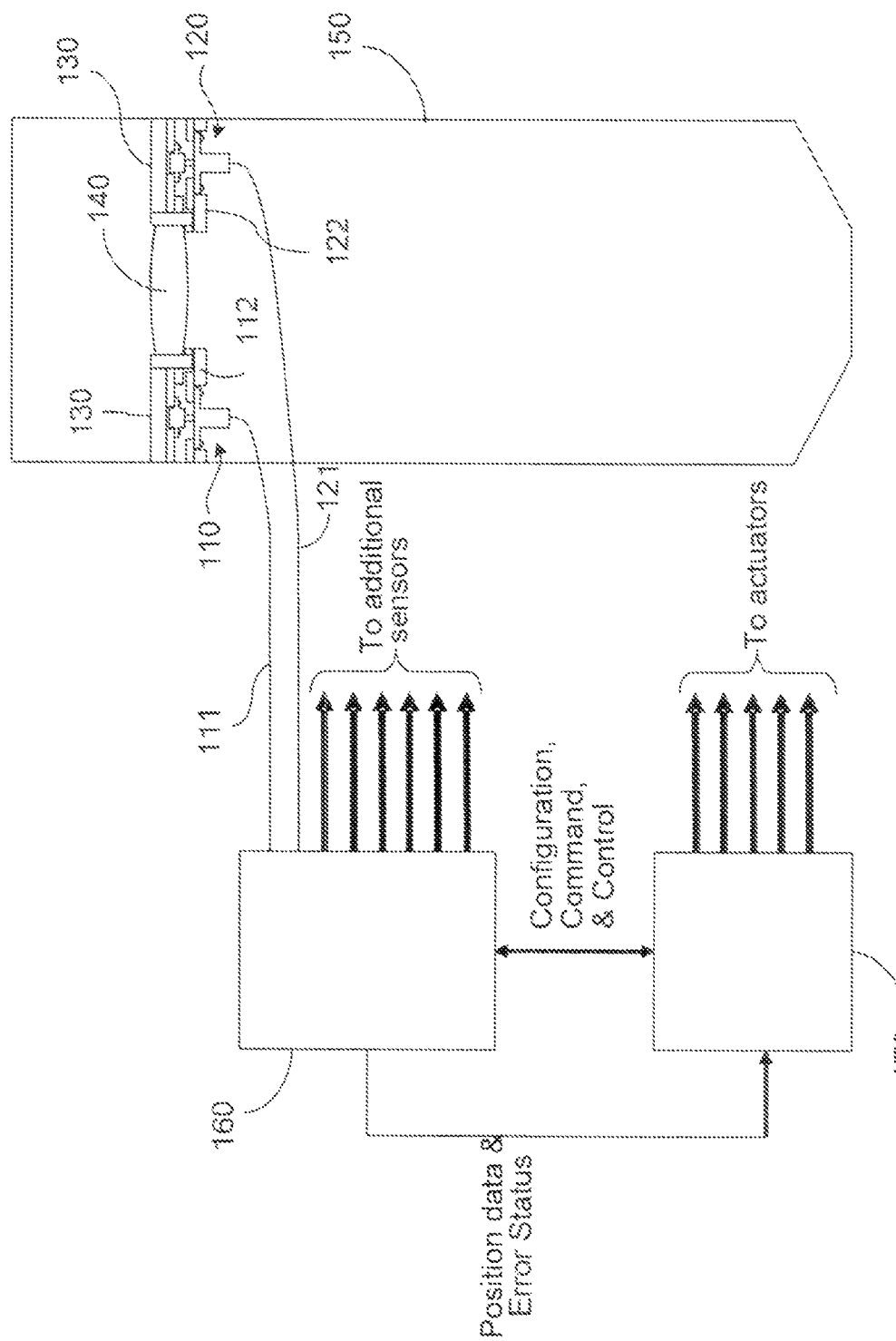
FIG. 1 is a schematic diagram of a sensor system for monitoring the position of components in a projection objective assembly.

Referring to FIG. 1, a sensor system, including two sensors, 110 and 120, is arranged to monitor the position of a frame element 130 of a lens 140 in a projection objective (PO) assembly 150. Sensors 110 and 120 are embedded in PO assembly 150, being attached to frame elements 112 and 122, respectively. The sensor system also includes a light source/detector (SD unit) unit SD unit 160, which includes a light source, detectors, and signal processing electronics. SD unit 160 is connected to sensors 110 and 120 via optical fibers 111 and 121, respectively, and to other sensors via other optical fibers. During operation, SD unit 160 directs light from a source (e.g., a laser or an LED) through fibers 111 and 121 to sensors 110 and 120. Fibers 111 and 121 also deliver light from sensors 110 and 120, respectively, to one or more detectors in SD unit 160.

SD unit 160 is also in communication with a servo controller 170, which sends signals to actuators (e.g., piezoelectric actuators) in PO assembly 150 that are configured to adjust the position of lens 140 and other components in the PO assembly in response to signals from SD unit 160.

Sensors

Figure 2:
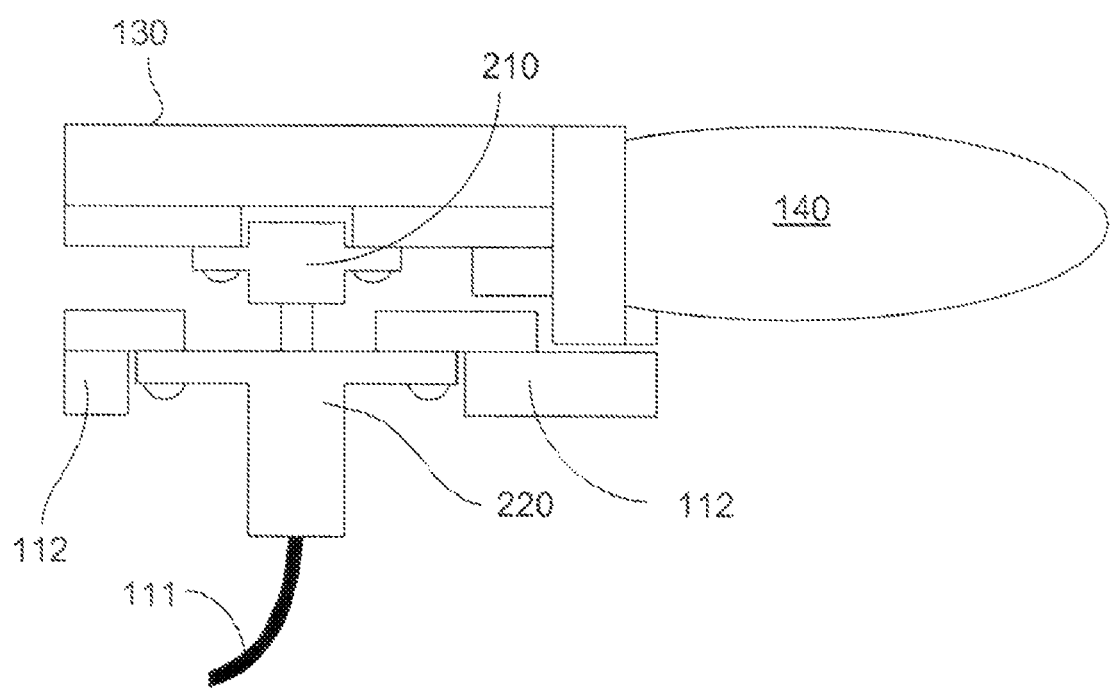
FIG. 2 is a schematic diagram of a sensor mounted in a projection objective assembly.

Referring to FIG. 2, sensor 110 includes a reflective optical target 210 and a an output coupler 220. Optical target 210 is attached to frame element 130 and output coupler 220 is attached to frame element 112 which is capable or movement relative to frame element 130.

In general, a passive optical sensor is an interferometer, which splits light delivered to the sensor into a measurement wavefront and a reference wavefront. The test wavefront is directed to optical target 210 and reflects back to the interferometer. The reference wavefront reflects from a reference surface. The interferometer recombines the reflected measurement and reference wavefronts, and the recombined light is then directed back to the optical fiber. The combined wavefronts interfere, producing an interferogram that contains information about the optical path difference (OPD) between the two wavefronts. The sensor system uses this information to determine the position of the optical target with respect to the passive optical sensor.

The specific information about the position of the optical target can vary. In some embodiments, it is sufficient to determine relative changes in the position between the passive optical sensor and the optical target, in which case, this information can be determined by monitoring changes in the phase of an interference signal corresponding to intensity variations in the interfering light received from each sensor. In certain embodiments, the absolute position of the optical target within a pre-established reference frame is desired. A variety of methods can be used to determine this information. Such methods are disclosed, for example, in *Fourier-transform phase-shifting interferometry*, by L. L. Deck, Applied Optics, Vol. 42, No. 13 (May 2003), and in *Time efficient Chinese remainder theorem algorithm for full-field fringe phase analysis in multi-wavelength interferometry*, by C. E. Towers, et al., Optics Express, Vol. 12, No. 6 (March 2004).

In general, the sensor system can be configured to operate at a variety of wavelengths, such as at visible or infrared wavelengths. In some embodiments, the sensor system operates at one or more wavelengths commonly used in the telecommunications industry (e.g., in a range from about 900 nm to about 1,600 nm).

The sensors can be relatively low power sensors. For example, the radiation power at each sensor (e.g., the radiation power exiting each fiber at the sensor end) can be about 10 mW or less (e.g., about 5 mW or less, about 4 mW or less, about 3 mW or less, about 2 mW or less, about 1 mW or less, 0.5 mW or less, 0.1 mW or less).

Figure 3:
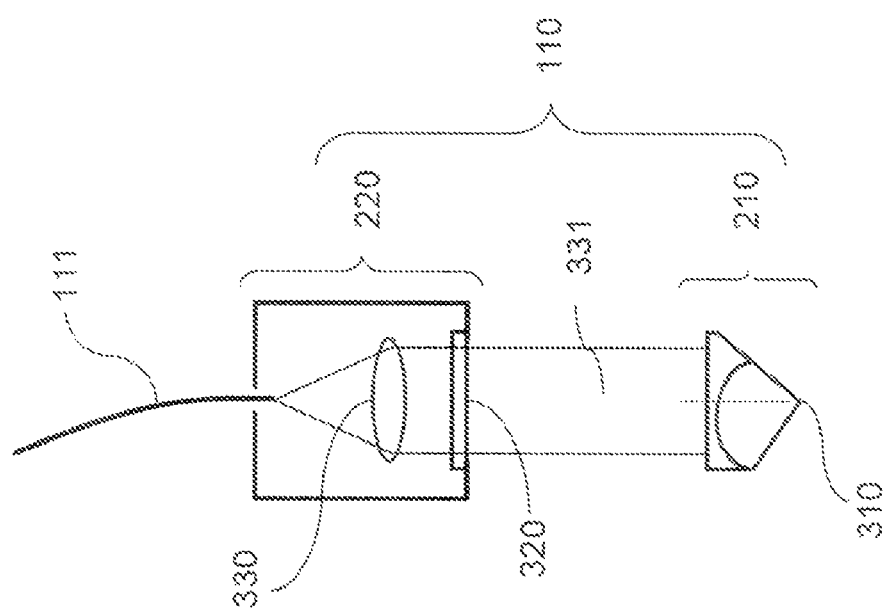
FIG. 3 is a schematic diagram an embodiment of a sensor.

In general, the configuration of sensors 110 and 120 may vary. Referring to FIG. 3, in some embodiments, target 210 includes a retroreflector 310 and passive optical sensor 220 includes a transmissive reference flat 320 (e.g., a glass flat) and a collimating lens 330. Collimating lens 330 collimates diverging light from fiber 111 and illuminates transmissive reference flat 320. Part of the light is reflected by transmissive reference flat 320 and is focused by lens 330 onto the end of fiber 111. Part of the light, indicated by beam 331, is transmitted by transmissive reference flat 330 and illuminates retroreflector 310. Retroreflector 310 reflects the light back towards passive optical sensor 220. This light is at least partially transmitted by transmissive reference flat 320, focused by lens 330 and coupled into the end of fiber 111. The wavefront reflected from retroreflector 310 interferes with the wavefront reflected from transmissive reference flat 320. The phases of the resulting interference can be monitored at SD unit 160, providing information about the relative position of retroreflector 310 with respect to passive optical sensor 220.

Figure 4A:
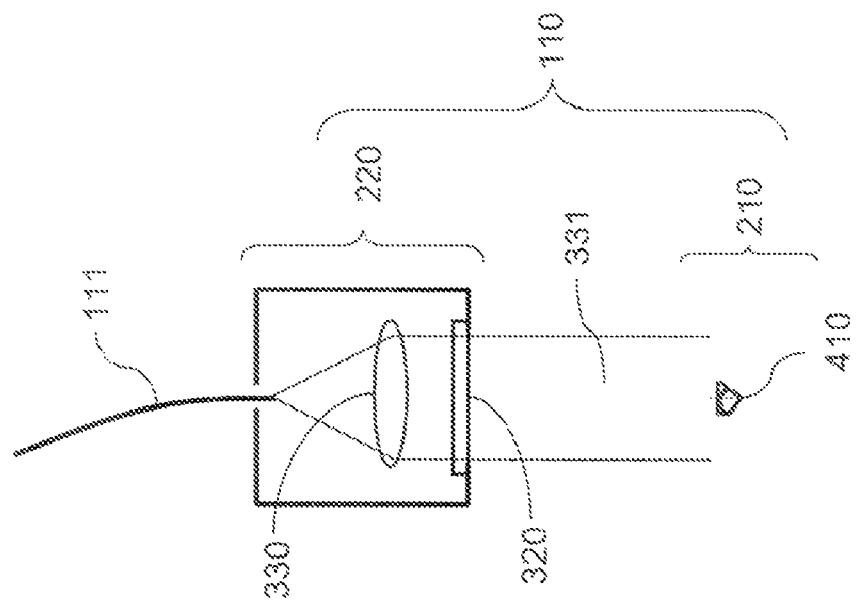
FIG. 4A is a schematic diagram an embodiment of a sensor.

Referring to FIG. 4A, in some embodiments, the size of the target optic can be smaller than the cross-sectional dimension of the illumination beam from passive optical sensor 220. As an example, retroreflector 410 is substantially smaller than beam 331. This type of configuration may be advantageous in that the characteristics of the illumination are nominally constant with respect to the target optic as the target optic moves from its home position. This can reduce requirements on retroreflector wavefront quality necessary to achieve certain desirable noise levels. Furthermore, this type of configuration can allow interference contrast to be improved while still keeping errors from higher-order interference effects relatively small.

In general, the beam's cross-sectional dimension relative to the size of the target reflector can vary. In some embodiments, the beam's cross-sectional dimension (e.g., diameter) can be relatively small compared to the size of the target reflector. For example, the beam's cross-sectional dimension (in at least one direction) is about 0.2 or less (e.g., about 0.1 or less, about 0.05 or less, about 0.01 or less) times the size of the target reflector.

In certain embodiments, the beam can have a relatively small cross-sectional dimension where it contacts the target. For example, the beam's cross-sectional dimension (e.g., diameter) in at least one direction can be about 0.5 mm or less (e.g., about 0.3 mm or less, about 0.2 mm or less, about 0.1 mm or less, about 0.05 mm or less, about 0.04 mm or less, about 0.03 mm or less, about 0.02 mm or less, about 0.01 mm or less). In some embodiments, the beam's cross-sectional dimension (e.g., diameter) in at least one direction can be about $100\lambda$ or less (e.g., about $90\lambda$ or less, about $80\lambda$ or less, about $70\lambda$ or less, about $60\lambda$ or less, about $50\lambda$ or less, about $40\lambda$ or less, about $30\lambda$ or less, about $20\lambda$ or less), where $\lambda$ is the wavelength of the beam.

For a beam with a Gaussian intensity profile that is radially-symmetric with respect to the beam propagation direction, the cross-sectional dimensions are measured where the beam intensity has 1/e of its peak value.

Figure 4C:
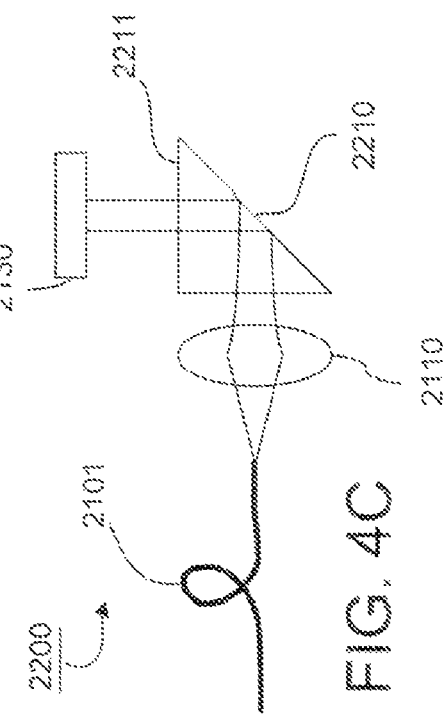
FIG. 4C is a schematic diagram an embodiment of a sensor.
Figure 4B:
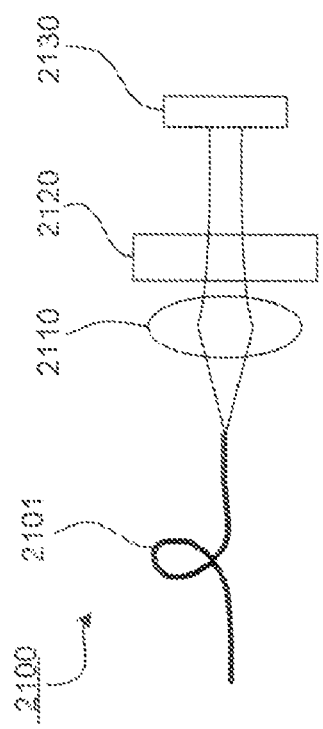
FIG. 4B is a schematic diagram an embodiment of a sensor.

Referring to FIG. 4B, an example of a sensor configuration utilizing a beam with a relatively small cross-sectional dimension is sensor 2100, which directs a beam to a plane minor target 2130. Sensor 2100 includes a transmissive reference flat 2120 (e.g., a glass flat) and a focusing lens 2110. Focusing lens 2110 collects diverging light from a fiber 2101 and directs the light through reference flat 2120 to target 2130. Part of the light is reflected by a surface of reference flat 2120 and is focused by lens 2110 onto the end of fiber 2101. Part of the light is transmitted by reference flat 2120 and illuminates reference flat 2120. Reference flat 2120 reflects the light back towards reference flat 2120, lens 2110, and fiber 2101. This light is at least partially transmitted by reference flat 2120, focused by lens 2110 and coupled into fiber 2101. The wavefront reflected from target 2130 interferes with the wavefront reflected from the surface of transmissive reference flat 2120. The phases of the resulting interference are monitored as for the embodiments described above, providing information about the relative position of minor 2130 with respect to reference flat 2120.

In some embodiments, mirror target 2130 is optimally positioned at the waist of the light beam. Such configurations can reduce sensitivity of the sensor to phase errors associated with tipping and/or tilting of minor target. In certain embodiments, positioning minor target 2130 at the waist of the light beam can reduce the amount by which the coupling efficiency of the reflected beam back into the fiber optic is reduced when the mirror target tips and/or tilts. Moreover, where the light beam has a narrow waist (e.g., a waist of diameter of about 100 μm or less, such as about 60 μm or less, about 50 μm or less, about 40 μm or less, about 30 μm or less), coupling efficiency losses due to tip/tilt of the mirror can be further reduced. In some embodiments, a change in the orientation (e.g., by tip or tilt) of the minor by 0.2 degrees or less (e.g., 0.1 degrees or less) from a nominal position can result in a reduction in the coupling efficiency to no less than 50% (e.g., about 60% or more, about 70% or more, about 80% or more, about 90% or more) of the coupling efficiency at the nominal position. Here, the nominal position refers to the position of the minor for which the coupling efficiency of the light beam into the fiber optic is a maximum.

Embodiments that utilize beams that have a relatively small cross-sectional dimension at the target can be relatively compact. For example, the distance from the end of fiber 2101 to mirror 2130 can be about 10 mm or less (e.g., about 5 mm or less, about 3 mm or less, about 2 mm or less, about 1.5 mm or less, about 1 mm or less).

FIG. 4C shows another example of a sensor that utilizes a beam having a relatively small cross-sectional dimension at the target. Specifically, FIG. 4C shows a sensor 2200 configured to direct radiation from fiber 2101 to target minor 2130 via lens 2110. The difference between sensor 2100, shown in FIG. 4B above, and sensor 2200 is that sensor 2200 has a prism 2220, rather than reference flat 2120, which directs the focused light from lens 2110 to target 2130. Here, the reference surface is a surface 2211 of prism 2220. Sensor 2200 can be used in applications where the structure into which the sensor is to be installed cannot accommodate an in-line beam path as in sensor 2100. In certain embodiments, additional optical components can be used to further contort the beam path as necessary.

Figure 4D:
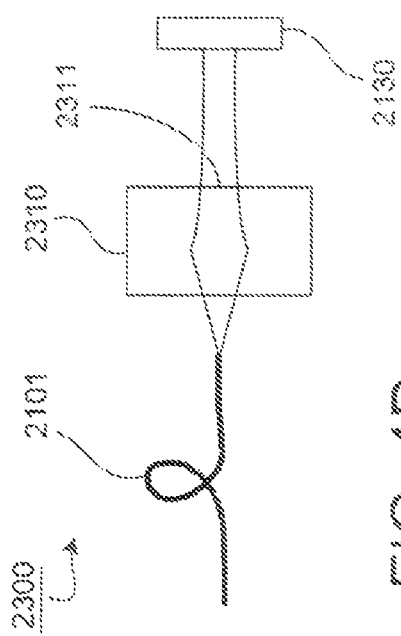
FIG. 4D is a schematic diagram an embodiment of a sensor.

In some embodiments, components can be used that provide the functionality of the focusing lens and provide a reference surface. For example, referring to FIG. 4D, a sensor 2300 can include a lens 2310 with a planar surface 2311 that acts as a reference surface. Examples of such lenses include planar-convex lenses and lenses formed from graded index materials (GRIN lenses). In some embodiments, GRIN lenses designed for use in telecommunications applications can be used.

Figure 4E:
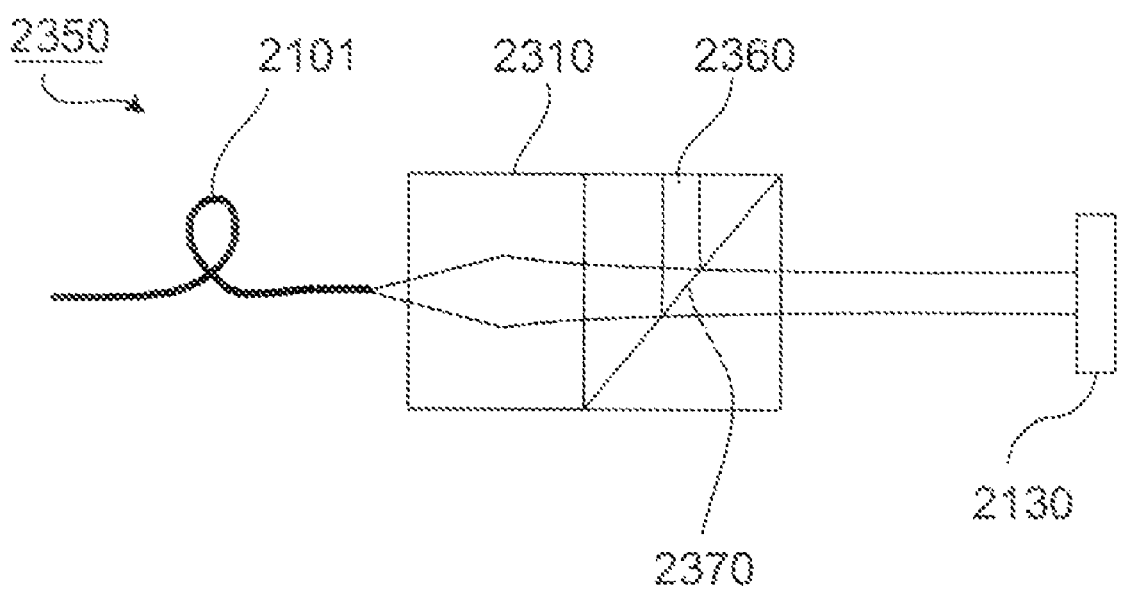
FIG. 4E is a schematic diagram an embodiment of a sensor.

FIG. 4E shows another embodiment of a sensor 2350 that includes a beam splitter cube 2370 in addition to lens 2310. A surface 2360 of beam splitter cube 2370 provides the reference surface for sensor 2350.

Figure 5:
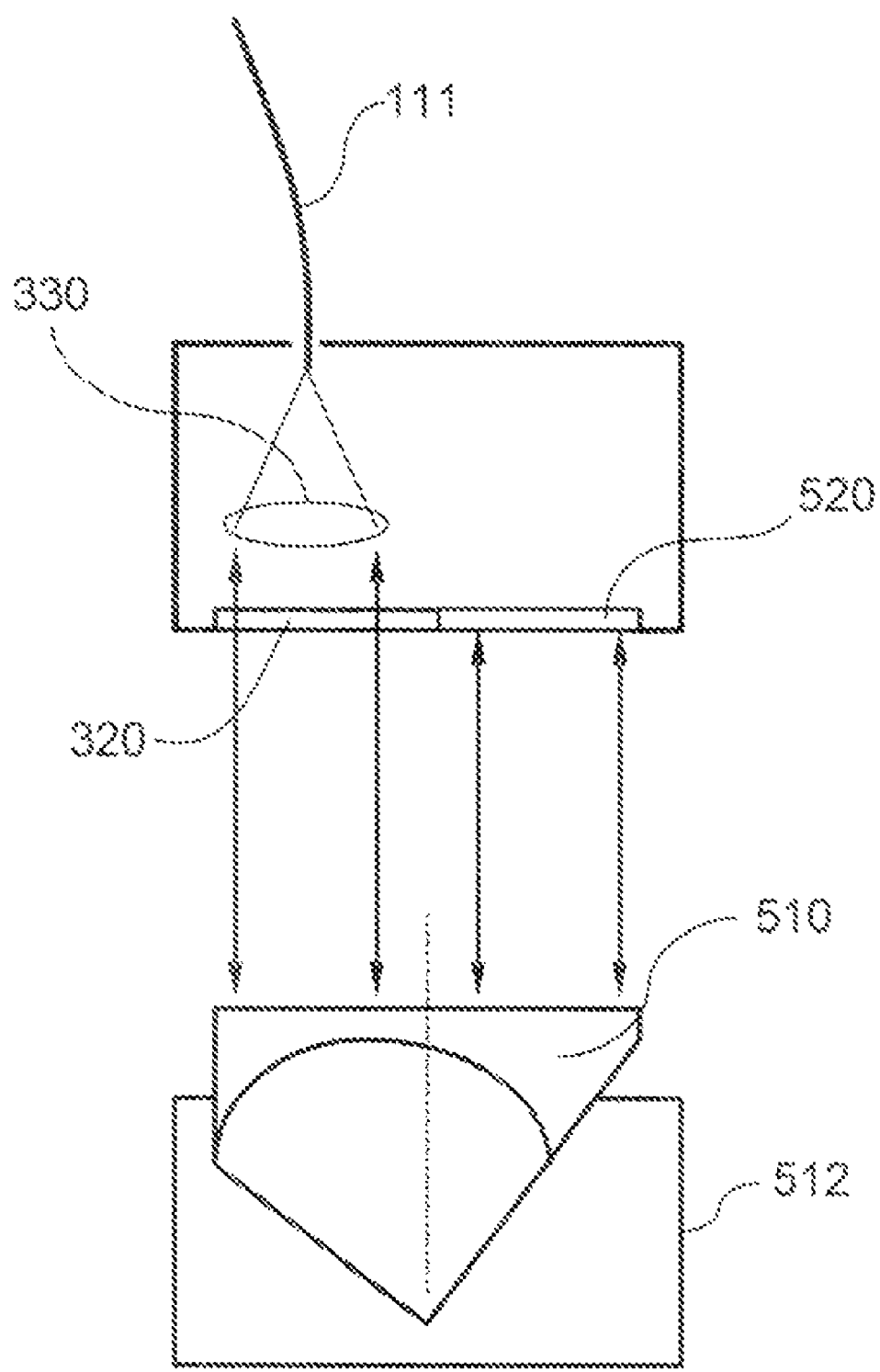
FIG. 5 is a schematic diagram an embodiment of a sensor.

Other configurations are also possible. For example, referring to FIG. 5, in some embodiments, sensors can be configured so that the light makes a double pass to the target. In this example, the passive optical sensor includes a minor 520, and the retroreflector 510 is sized so that, on its first pass, the illumination from the passive optical sensor is directed towards mirror 520. Mirror 520 reflects the light back to retroreflector 510, which directs the light back to transmissive reference flat 320 and lens 330.

The double pass may correct for effects of beam inversion that occur if the retroreflector is used alone and increases the sensitivity to retro motion.

Mounting target retroreflector 510 appropriately can compensate for the thermal dependence of the light path through retroreflector 510. For example, retroreflector 510 can be mounted in a mount 512 made from a material whose thermal expansion coefficient is such that the thermal expansion of the mount compensates for thermally induced OPD changes in the sensor, e.g., from thermally induced changes in the refractive index of the optical components in the sensor and/or in thermally induced physical path length changes in the sensor.

Figure 6:
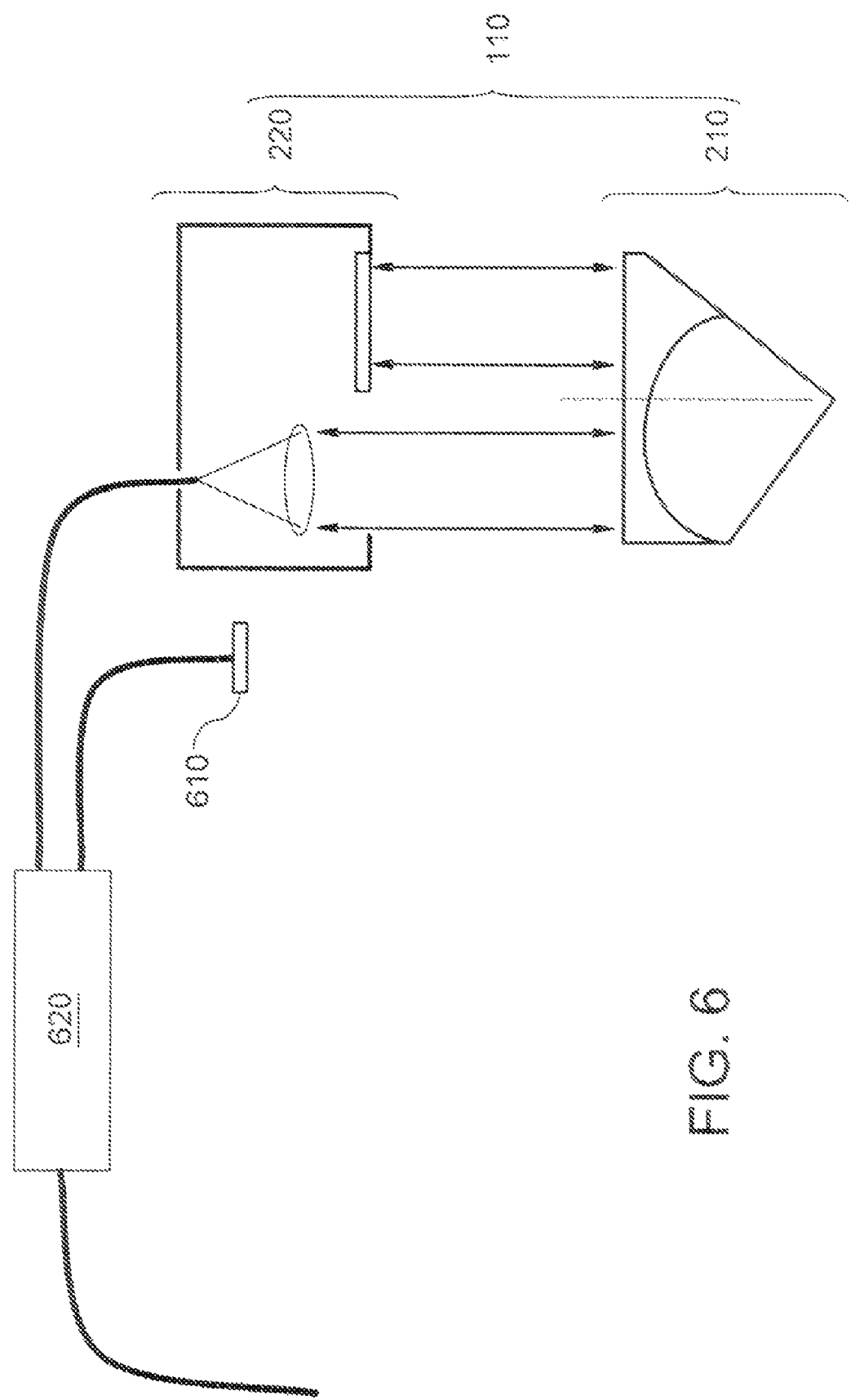
FIG. 6 is a schematic diagram an embodiment of a sensor.

In some embodiments, sensors can include a remote reference surface. For example, referring to FIG. 6, in some embodiments, a fiber coupler/splitter 620 directs light to a remote reference minor 610 in addition to the sensor 110. Using a remote reference allows one to set a nominal standoff to different lengths. Using a remote reference can also allow one to compensate for thermal effects in the sensor optics. For example, in some embodiments, one can use a fiber pigtail to both modify the overall sensor OPD and/or use the thermal OPD variation in the pigtail (e.g., from thermally induced changes in the refractive index of the optical components in the sensor and/or in thermally induced physical path length changes in the sensor) to compensate for similar effects from glass or other optical materials in the main sensor cavity.

Figure 7:
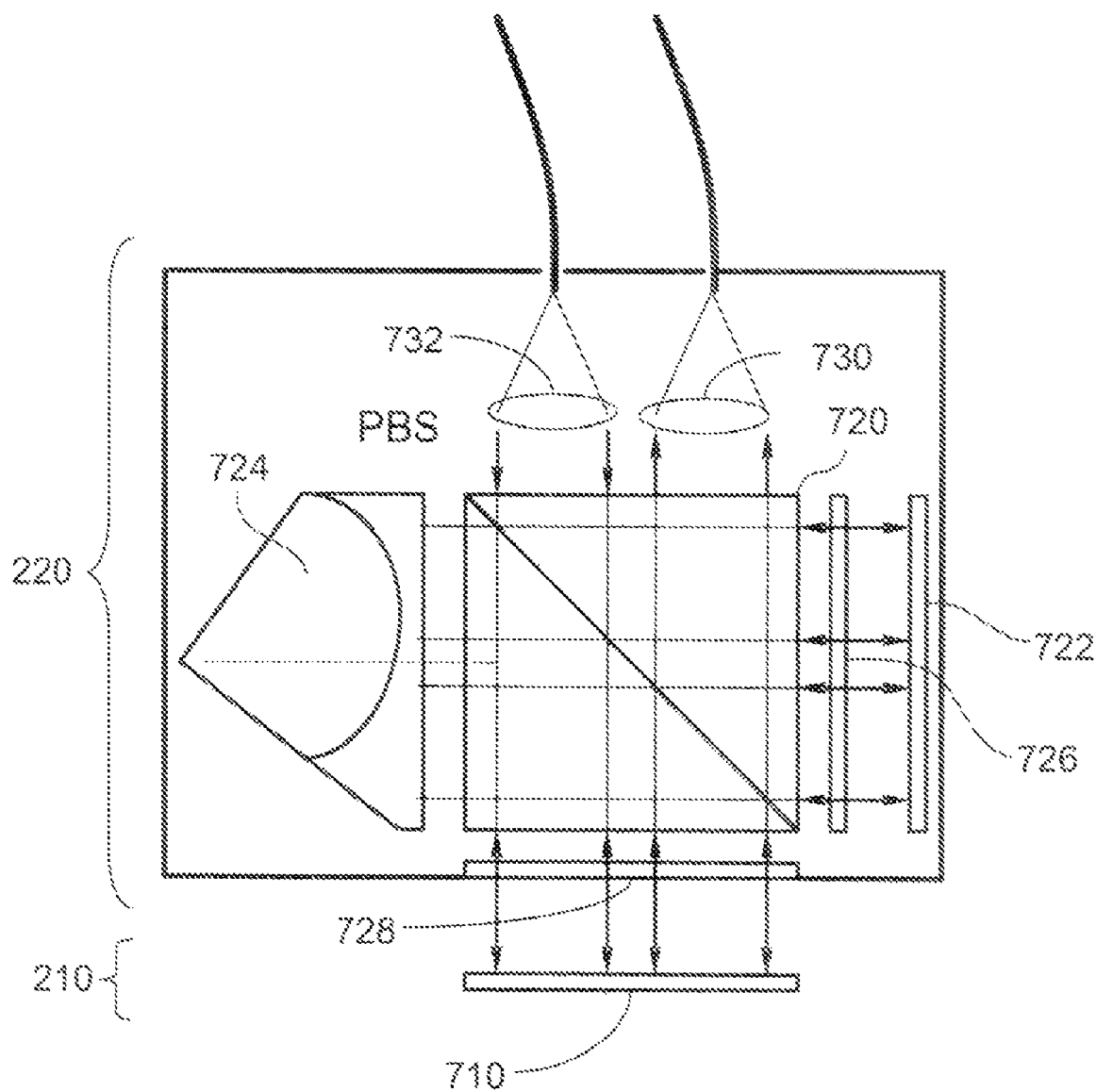
FIG. 7 is a schematic diagram an embodiment of a sensor.

In general, sensor systems can utilize polarized or unpolarized light. Referring to FIG. 7, an example of a sensor that uses polarized light is shown. In this example, passive optical sensor 220 includes a polarizing beam splitter 720, a reference mirror 720, a retroreflector 724 and quarter wave plates 726 and 728. Target optic 210 includes a plane minor 710. This configuration corresponds to a high stability plane mirror interferometer (HSPMI). The input beam is coupled into the HSPMI via a first collimating lens 730. The output beam is coupled into a different fiber via a second lens 732.

Figure 8:
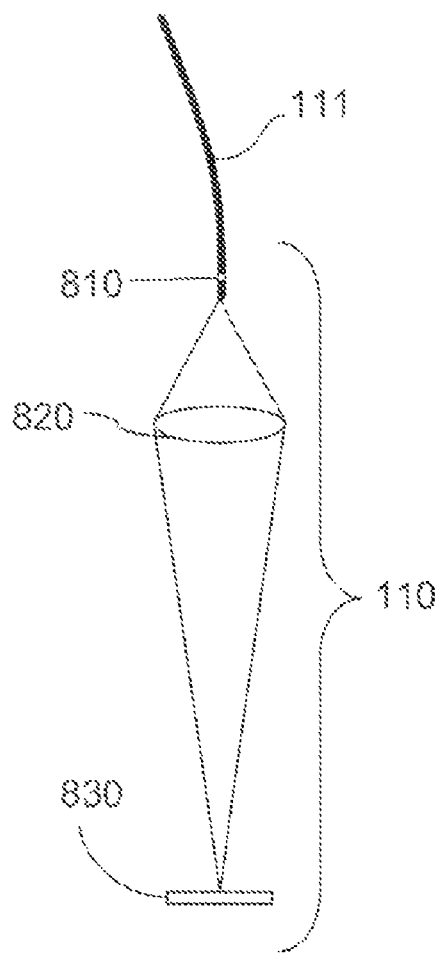
FIG. 8 is a schematic diagram an embodiment of a sensor.

Referring to FIG. 8, in some embodiments, the end face 810 of fiber 111 can be used to provide the reference surface of sensor 110. Here, sensor 110 includes a plane minor target 830 and a lens 820 which focuses light emitted from fiber 111 to a spot at or near target 830, and also focuses light reflected from target 830 back onto the end of fiber 111.

Figure 9:
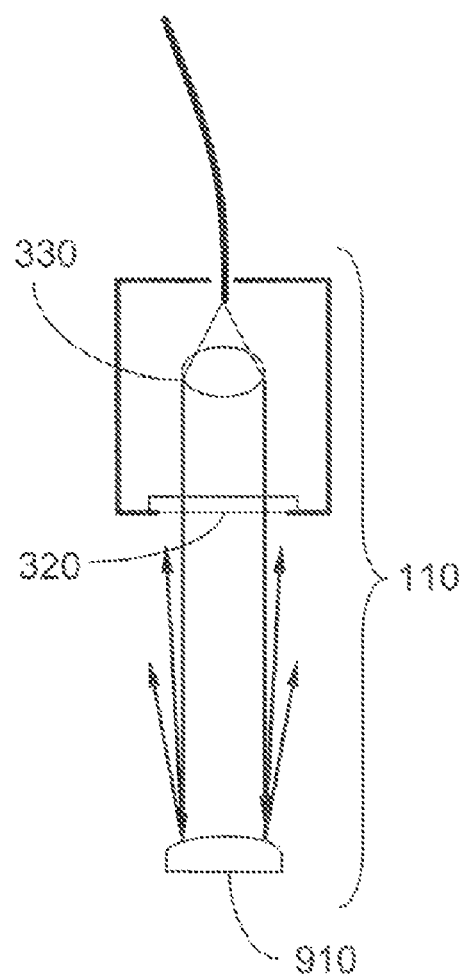
FIG. 9 is a schematic diagram an embodiment of a sensor.

While the foregoing embodiments, either a retroreflector or a plane minor is used as the target optic, other optical components can also be used for this purpose. For example, referring to FIG. 9, in some embodiments, a non-planar reflector 910 can be used as the target optic. Such a target may be more tolerant to misalignment between passive optical sensor 220 and the target.

Figure 10:
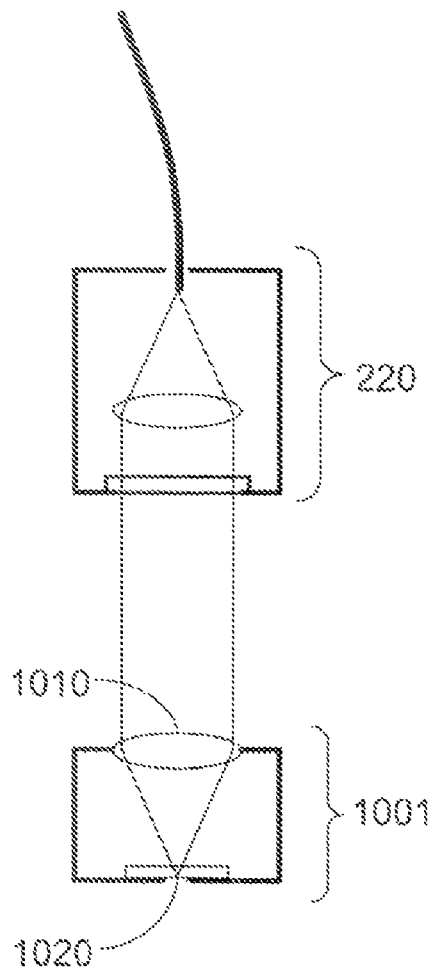
FIG. 10 is a schematic diagram an embodiment of a sensor.

As another example, and with reference to FIG. 10, in some embodiments, a cat's eye type retroreflector 1001 can be used for the target optic. Cat's eye retroreflector 1001 includes a lens 1010 (e.g., a spherical lens) and a minor 1020 (e.g., a planar or curved minor). Incoming light is focused by lens 1010 onto mirror 1020 and reflected back to lens 1010 by mirror 1020. Reflected light follows the reverse path through lens 1010 back to passive optical sensor 220. Configurations using cat's eye retroreflectors can provide increased tolerance of angular alignment errors relative to other configurations.

Figure 11:
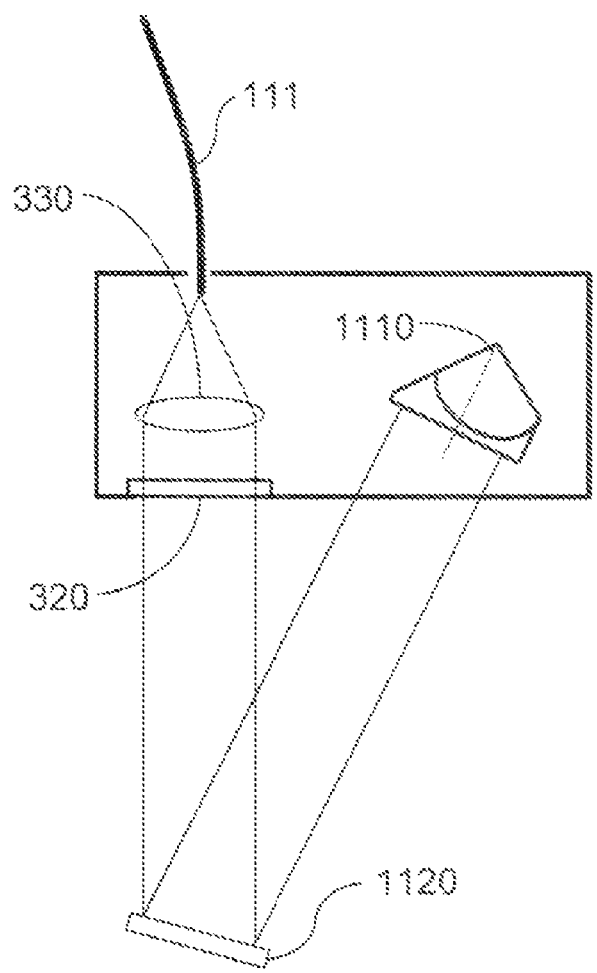
FIG. 11 is a schematic diagram an embodiment of a sensor.

Referring to FIG. 11, another example of a sensor where the light makes a double pass to the target optic is shown. In this embodiment, passive optical sensor 220 includes a retroreflector 1110 in addition to lens 330 and transmissive optical flat 320. The target in this case is a plane mirror 1120, oriented to reflect light from optical fiber 111 towards retroreflector 1110.

Figure 12:
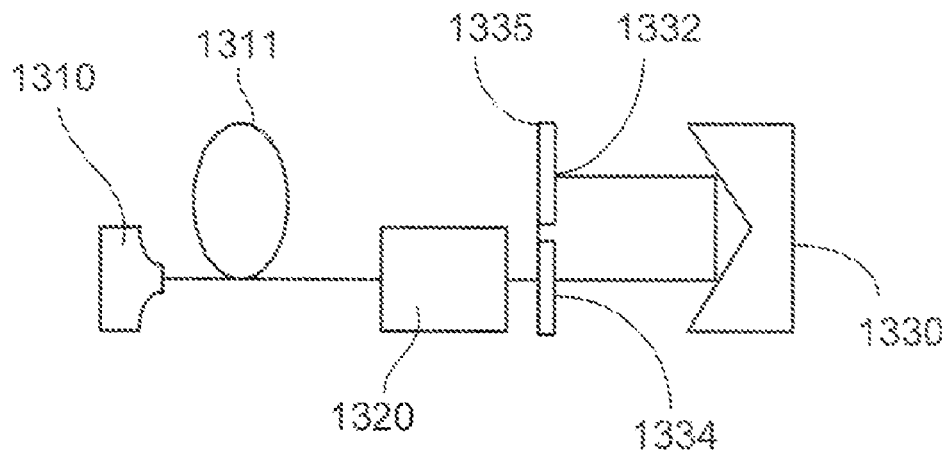
FIGS. 12 and 13 are a schematic diagram and a plan view, respectively, of an embodiment of a sensor.
Figure 13:
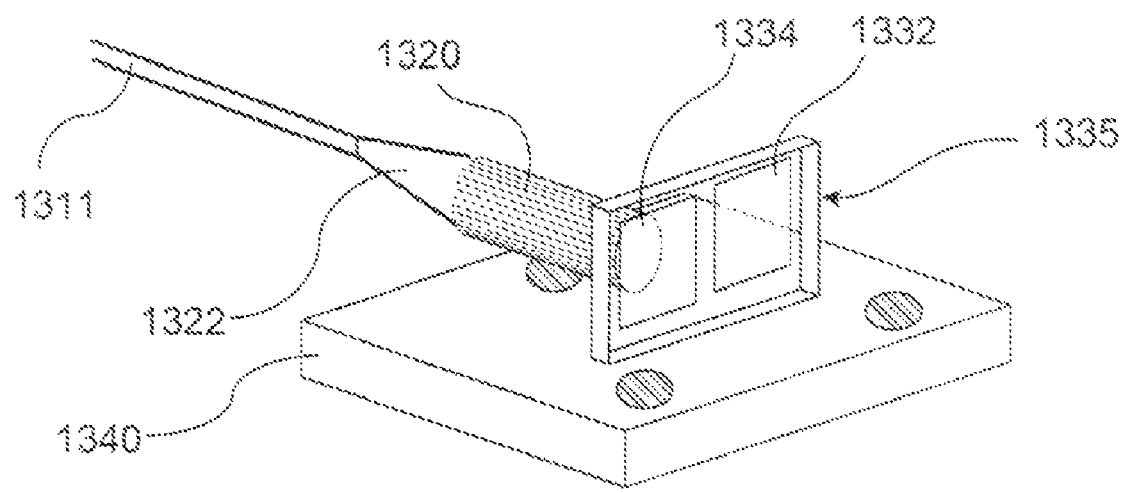

Referring to FIG. 12 and FIG. 13, a further example of a sensor is shown. In this example, the sensor is arranged to receive light from an SD unit 1310 via an optical fiber 1311 which is attached to a fiber collimator 1320 by a strain relief element 1322. Fiber collimator 1320 is positioned to direct light from the fiber to a retroreflector 1330. A window 1335 is positioned between fiber collimator 1320 and retroreflector 1335. Both the fiber collimator 1320 and window 1335 are mounted to a mounting plate 1340. Retroreflector 1330, the optical target in this sensor, is mounted remotely from mounting plate 1340. Half of a surface of window 1335 is coated with a non-polarizing beam splitter coating 1334, and the other half is coated with a reflective coating 1332 (e.g., silver or aluminum for visible light). Light emitted from fiber collimator 1320 impinges initially on the portion of the window surface coated with non-polarizing beam splitter coating 1334. A portion of this light is transmitted by the window towards retroreflector 1330, while a portion is reflected back towards fiber collimator 1220, providing a test wavefront. The transmitted portion is reflected by retroreflector 1330 and impinges on reflective coating 1332. It reflects from the coating and returns along the same path to fiber collimator 1320, providing the measurement wavefront.

In general, as discussed above, the light source/detector unit (SD unit) in a sensor system is remote from the actual sensor's themselves. In certain embodiments, the only information conduit between the SD unit and the sensors are optical fibers. In embodiments where the sensors are passive (e.g., the sensors do not include any electrical circuitry), no electrical wires are necessary to connect the SD unit to the sensors.

Sensor System Architectures and Measurement Techniques

In general, a variety of different sensor system architectures are possible. The system architecture is usually selected based on a variety of factors, such as the measurement technology being employed to monitor the optical component positions, as well as other factors such as cost. In some embodiments, multiplexed configurations can be used. In general, multiplexed configurations refer to configurations where signals from multiple sensors are carried over a common transmission line (e.g., optical fiber). For example, referring to FIG. 14A, an SD unit 1410 is connected directly to one of four sensors 1420, and indirectly to the other three. In other words, the sensors are connected serially to SD unit 1410. Light travels back and forth from SD unit 1410 to sensors 1420 by a common optical fiber. Sensors 1420 are embedded in a PO assembly 1401 assembly, while SD unit 1410 is remote from the PO assembly. The sensor system may also include a wave meter 1430, which is connected to SD unit 1410.

Multiplexing can be achieved in a variety of different ways. For example, in some embodiments, frequency encoding can be used. Each sensor can be configured so that the OPD for different sensors is nominally different. Accordingly, the signal for each sensor will have a different frequency from the signal for other sensors if wavelength tuning is employed. Performing a frequency analysis on the signal allows one to distinguish between the signals from the different sensors.

Alternatively, or additionally, wavelength division can be used for multiplexing. For example, light at a variety of different wavelengths can be delivered to the sensors. Each sensor includes a wavelength filter that passes a wavelength or wavelength band different from the other filters. In this way, each sensor's signal can be distinguished by looking at the appropriate wavelength signature in the return signal.

Figure 14C:
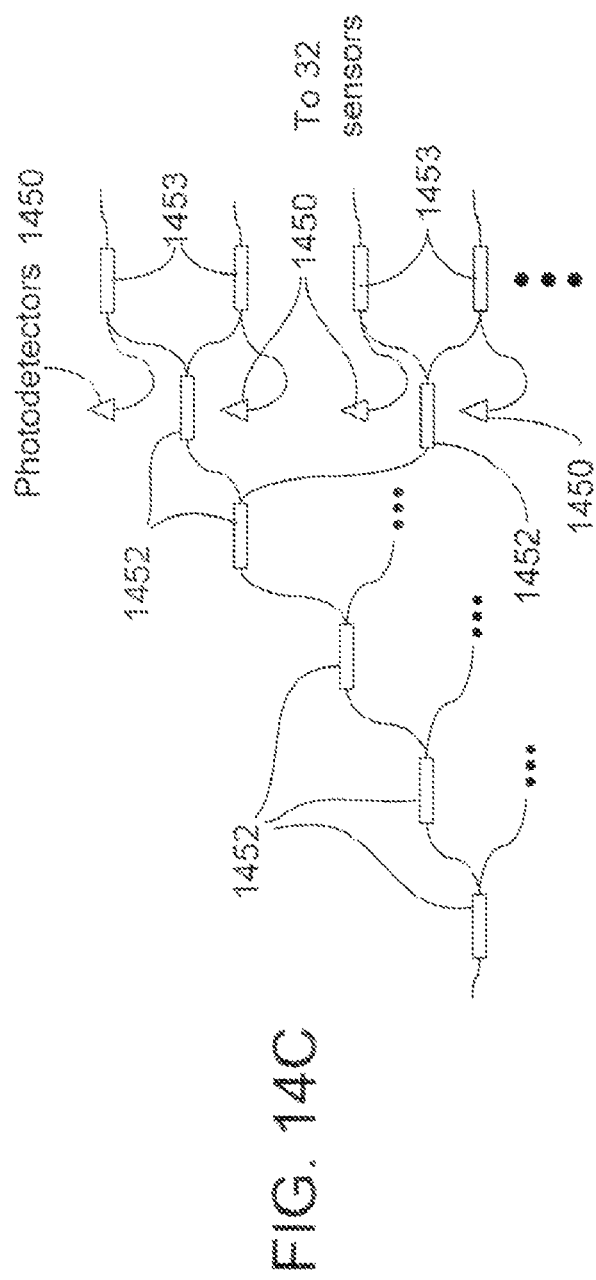
FIG. 14C is a schematic diagram of a optical fiber distribution network.

In some embodiments, light is distributed to and/or collected from the sensors using a distributed network. Referring to FIG. 14C, an example of a distributed network include a number of fiber optic couplers 1452 having three ports (e.g., one input port and two output ports or two input ports and one output port, depending upon whether the coupler is acting as a splitter or combiner, respectively). At the last stage of the network the output couplers 1453 are either circulators or standard 2×2 couplers with one port left unused. Also shown in the network in FIG. 14C are detectors 1450, which receive optical signals from the sensors. In principle, networks can be used to deliver and/or collect signals from any number of sensors, depending upon the specific implementation. In some embodiments, systems can be configured to include 10 or more sensors (e.g., 12 or more sensors, 15 or more sensors, 18 or more sensors, 20 or more sensors, 21 sensors or more sensors, 25 or more sensors, 30 or more sensors, 32 sensors or more sensors, 35 or more sensors).

In some embodiments, the last stage splitter in a network can be replaced with circulators. Such configurations can yield a 4× optical efficiency boost, if desired.

In certain embodiments, coherence encoding can be used for multiplexing purposes. Coherence encoding typically involves using a broad-band light source and providing each sensor with unique non-overlapping OPDs. Each sensor can then be identified by the measured OPD. For example, each sensor can have a different nominal OPD and pulses of illumination can be used to measure the OPD. Consider two time-separated pulses that are directed to a sensor wherein the sensor includes a 2-surface cavity separated by a particular optical distance. If the pulse time separation equals the round trip time for a pulse to traverse the cavity then the two separate pulses can interfere. So by varying the frequency of the pulses one can look for the frequency that produces interference and thereby deduce the cavity length. In this way the SD unit can identify signals from the different sensors.

Coherence encoding can also be realized using coupled cavity interferometry. In coupled cavity interferometry a cavity is interrogated by illuminating it with broad-band light from another cavity that can be scanned. This can allow scanning while the OPD of the sensor cavity remains fixed.

In some embodiments, each sensor is connected to the SD unit by its own fiber, and a common light source is used to deliver light to each sensor (see, e.g., FIG. 14B). For example, referring to FIG. 14B, sensors 1420 are connected in parallel to SD unit 1410. In other words, each sensor is connected directly to SD unit 1410 via a respective optical fiber.

In some embodiments, scanning white-light interferometry can be used. For example, in each sensor the reference surface (e.g., a remote reference surface in a coupled cavity) can be moved until interference is observed.

In certain embodiments, polarization coding can be used, where two beams of different optical frequencies and having opposite polarizations are made to separately traverse either the test or reference leg of the interferometer. Upon return the beams are made to interfere (e.g., via a polarizer) and the frequency of the interference (equal to the difference between the two optical frequencies) is measured. If one of the legs is in motion relative to the other, its light is Doppler shifted, changing the interference frequency.

In some embodiments, multiple wavelength interferometry is used. For example, a sensor cavity can be illuminated (either sequentially of simultaneously) with a number of well-known, discrete wavelengths and the signal phase shift is determined as a function of wavelength. The phase shifts can be found in a number of ways, for example, by phase shifting each of the discrete wavelengths. Alternatively, or additionally, one can measure the interference intensities at each wavelength and then determine the cavity length via a best fit of the intensity vs. wavelength with a physical model of the system.

In certain embodiments, frequency tuning can be used. Frequency tuning is described in *Fourier-transform phase-shifting interferometry*, by L. L. Deck, Applied Optics, Vol. 42, No. 13 (May 2003), mentioned supra. If one can phase continuously tune the wavelength over a long enough range, one can find the cavity length by either Fourier analysis of the interference or by least squares fitting to a physical model.

Systems can be based on one or more basic interferometric technologies such as swept wavelength interferometry, coupled cavity interferometry, coherence scanning interferometry, heterodyne interferometry, and/or multi-wavelength interferometry. Exemplary systems are described below.

(A) Coherence Scanning Interferometry with Coupled Cavity

Coherence scanning interferometry utilizes a light source with a relatively short coherence length (e.g., a broadband light source). Accordingly, interference fringes are detected only for OPD's at or close to zero. Exploiting the interference localization to eliminate the cyclic ambiguity in conventional laser interferometry, coherence scanning interferometry can be used for absolute OPD measurements. Since the sensor is passive, the OPD is scanned indirectly via a coupled cavity arrangement.

Figure 15:
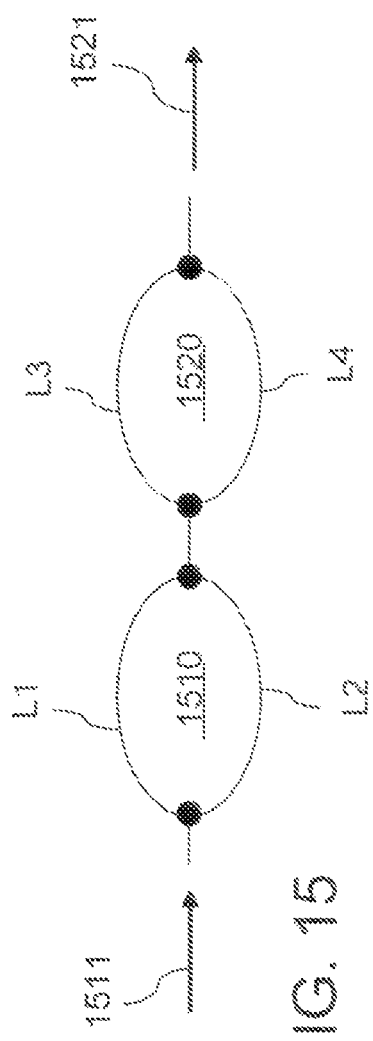
FIG. 15 is a schematic diagram of a coupled cavity system.

Using coupled cavity geometry can permit remote scanning at cost of added complexity and reduced fringe contrast relative to other methods, and it links the source coherence properties to the test cavity OPD range. Referring to FIG. 15, in general, a coupled cavity configuration includes a scan cavity 1510 and a sensor cavity 1520. Scan cavity 1510 includes two paths L1 and L2, at least one of which is variable. Sensor cavity 1520 includes two paths L3 and L4. Accordingly, there are four possible paths for an input signal 1511 to exit signal 1521 corresponding to the combinations of the two legs from each cavity (L1+L3, L1+L4, L2+L3, L2+L4).

To ensure that interference from unwanted path combinations does not influence interference from the cavity of interest, the OPDs between the paths should be greater than the coherence length of the light. In other words, the OPD of the sensor cavity should be greater than the source coherence length, which tends to increase sensor gaps.

Figure 16:
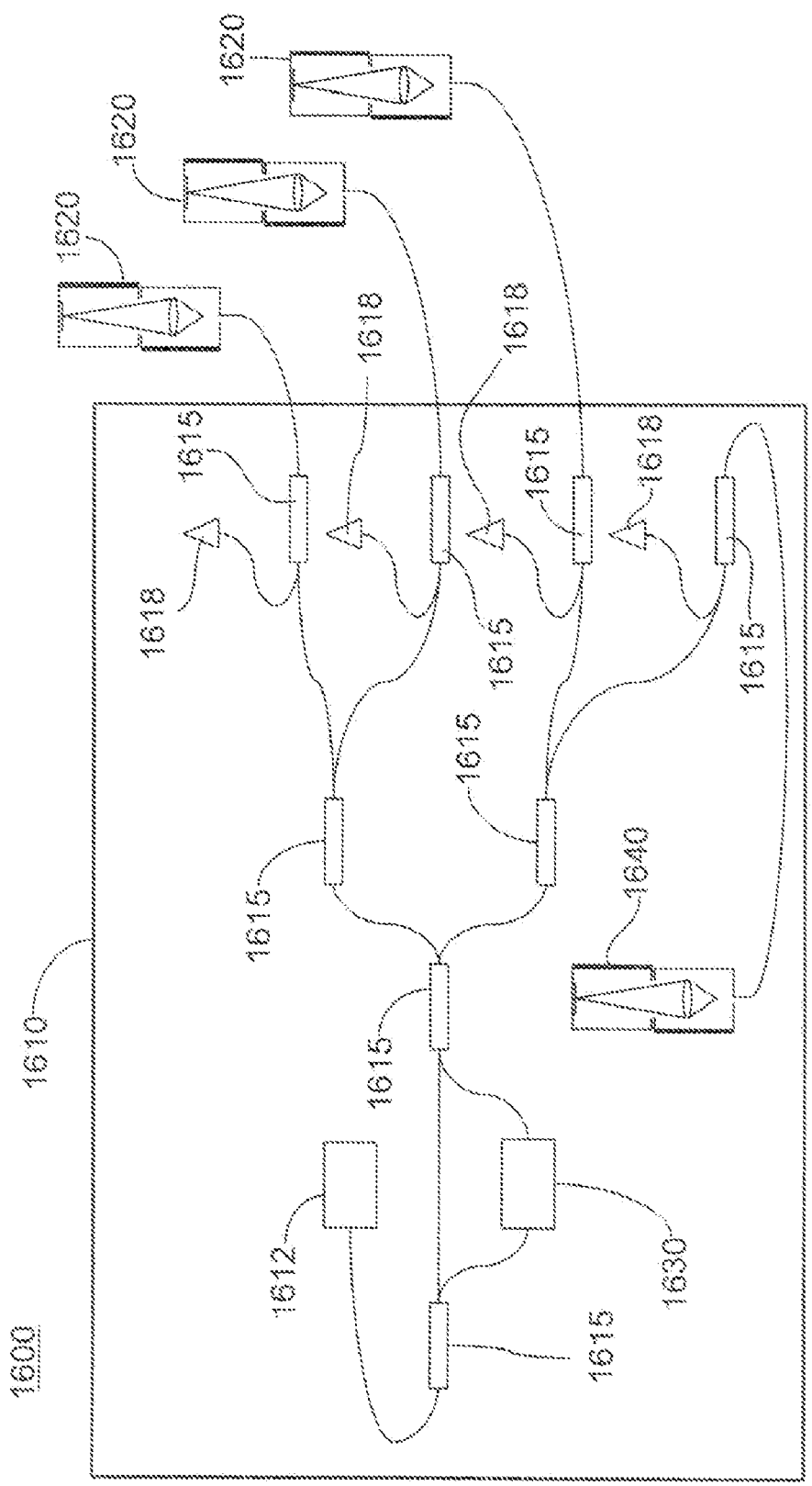
FIG. 16 is a schematic diagram of a sensor system.

Referring to FIG. 16, shows a coherence scanning interferometry system 1600 with a coupled cavity. System 1600 features a SD unit 1610 connected via optical fibers to sensors 1620. SD unit 1610 includes fiber optic couplers 1615, detectors 1618, and a reference cavity 1640. In addition, SD unit 1610 includes an OPD shifter 1630, which provides the variable OPD in the coupled cavity, and a low-coherence source 1612, such as a broad-spectrum super-luminescent diode (SLED). SLEDs with suitable power and broad spectral widths are available, for example, from EM4 Inc. (Bedford, Mass.), Covega (Jessup, Md.), and DenseLight Semiconductors (Singapore). In some embodiments, the source provides a 60 nm Gaussian spectral width (full width at half maximum, FWHM) centered at 1550 nm. Such a source produces a coherence function with a 20 μm width (FWHM).

Frequency domain analysis can be used to analyze the data. Frequency domain analysis methods are disclosed, for example, in P. de Groot and L. Deck, "Surface profiling by analysis of white light interferograms in the spatial frequency domain", *Journal of Modern Optics* 42: 389-401 (1995), the entire contents of which are incorporated herein by reference. In some embodiments, a linear scan of the data can be analyzed via computation of a single 4096 point Fast Fourier Transform (FFT) which, with high speed digital signal processors and/or programmable logic circuits, can be completed in about 0.25 ms. The result can therefore be output before a subsequent measurement, but the data age will depend on the analysis time and the cavity OPD. If the scan is nonlinear (but known), a more complicated analysis can be performed.

Figure 17A:
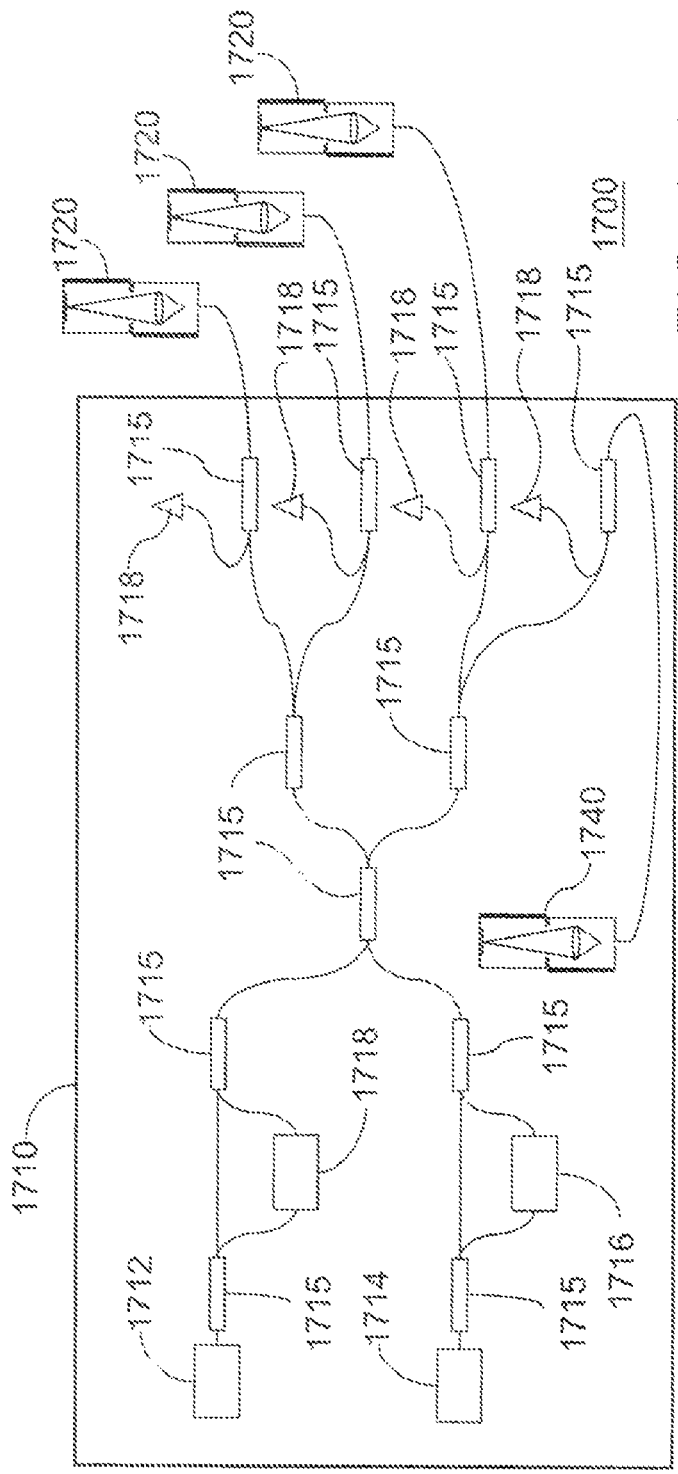
FIG. 17A is a schematic diagram of a sensor system.

(B) Coherence Scanning Interferometry with Coupled Cavity and Heterodyne Interferometry Coherence scanning interferometry using a coupled cavity and heterodyne interferometry splits the measurement into two modes. It uses a relatively slow coherence scan to find the cavity absolute OPD for all sensors simultaneously (referred to as "absolute mode"), and a rapid heterodyne technique to track the variation of the OPD from that point on (referred as "relative mode"). Referring to FIG. 17A, a system 1700 includes an SD unit 1710 and sensors 1720. SD unit 1720 includes fiber optic couplers 1715, detectors 1718, and a reference cavity 1740. In addition, SD unit 1710 includes a low-coherence source 1712, a quasi narrow band source 1714, an OPD shifter 1718, and a frequency modulator 1716. OPD shifter 1718 is provided in one leg of a coupled cavity positioned between source 1712 and the network connecting to sensors 1720. Frequency modulator is provided in one leg of a second coupled cavity positioned between source 1714 and the network connecting to sensors 1720

During operation, low-coherence source 1712 is used for the absolute mode. The mode can be performed once on startup (or as needed) to obtain the absolute OPD of each sensor simultaneously. The speed of this measurement can be relatively slow (e.g., a few seconds) and it can be assumed that the sensor OPDs do not change during this time. With the exception of the scan speed, the procedure and analysis is similar to the one described above with respect to subsection A. As long as the sensors are stable enough so that the fringe order does not change significantly between absolute and relative modes, the two measurements can be combined to determine the absolute sensor OPD to sub-nm precision.

Figure 17B:
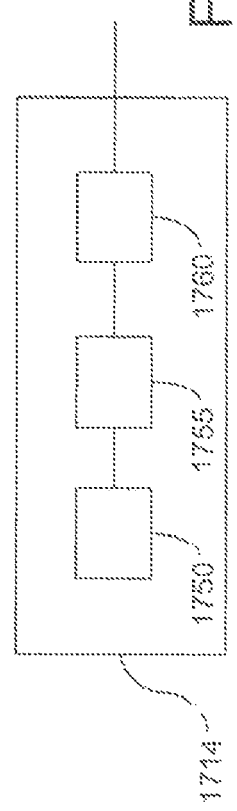
FIG. 17B is a schematic diagram of a source module.

In relative mode, quasi narrow band source 1714 is used. The coherence length of the source should be long enough to observe robust interference over the full range of sensor OPDs, but short enough to exclude the extra cavity interference that comes with the coupled cavity system. A source with a suitable coherence shape can be constructed using a SLED and filter with, if desired, an amplifier to recover the required intensity. Referring to FIG. 17B, an exemplary quasi narrow band source includes a broadband source 1750 (e.g., a SLED), an inline fiber optic bandpass filter 1755 (e.g., having a 1 nm pass band width), and a semiconductor optical amplifier (SOA) 1760 for amplifying the signal exiting the bandpass filter.

Figure 18:
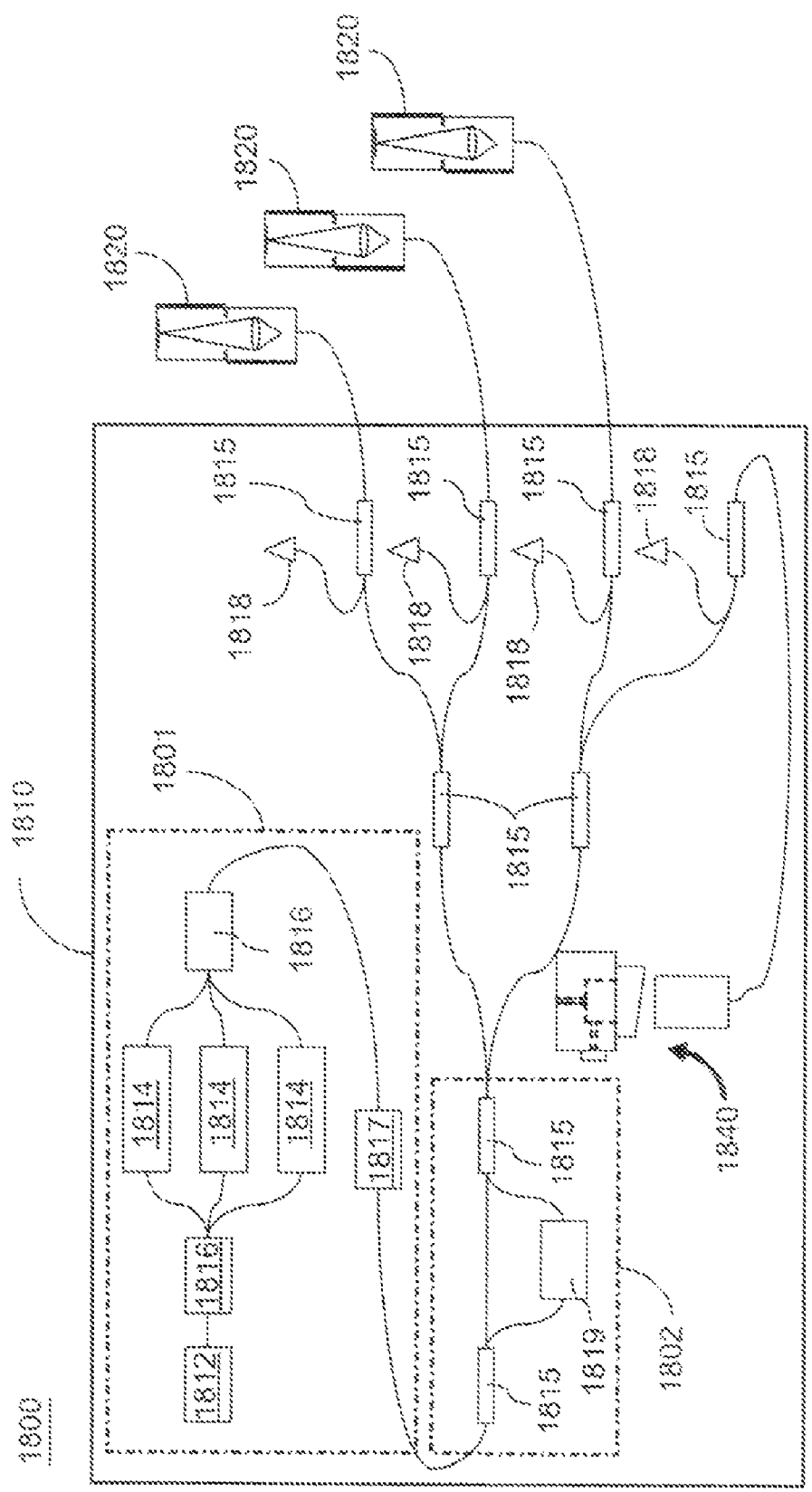
FIG. 18 is a schematic diagram of a sensor system.

For the heterodyne mode, the coupled cavity that feeds the narrow spectrum light to the sensors contains frequency modulator 1716. Frequency modulator 1716 changes the optical frequency of the light traveling in at least one of the legs of the cavity to produce the heterodyne frequency. The phase measurements can then be determined in a manner similar to the methods described, for example, in U.S. Pat. No. 5,249,030, the entire contents of which is incorporated herein by reference (C) Multi-wavelength Interferometry and Heterodyne Interferometry This technique uses two or more discrete wavelengths to calculate the absolute cavity OPD using the concept of equivalent wavelengths, or the method of exact fractions if more than two wavelengths are used. Referring to FIG. 18, a system 1800 configured to implement this technique includes an SD unit 1810 and sensors 1820. SD unit 1810 includes a source module 1801 and a modulator module 1802, which receives light from the source module and directs the light (after modulation to produce the heterodyned signal) onto the fiber optic distribution network that connects to sensors 1820 and detectors 1818. SD unit 1810 also includes a reference cavity 1840.

As shown in FIG. 18, source module 1801 includes a low coherence source 1812 (e.g., a SLED), fiber optic switches 1816, and filters 1814. In addition source module 1801 includes an optical amplifier 1817 (e.g., a SOA or erbium doped fiber amplifier (EDFA)) which amplifiers the signal at one or more wavelengths from the source 1812. In some embodiments, optical amplifier 1817 provides adjustable amplification. Modulator module 1802 includes two couplers 1815 defining a coupled cavity with specific OPD nominally equal to the sensor OPDs. A frequency modular 1819 is positioned in one of the legs of the coupled cavity.

Like the implementation discussed previously, the measurement sequence is separated into two modes, an absolute mode and a relative mode. In absolute mode, absolute measurement of the sensor OPD's are determined by measuring the phase differences between two or more well-known wavelengths, the phases being obtained through the use of heterodyne interferometry, and relating these differences to the equivalent wavelength. The relative measurement uses just one wavelength in a similar manner to the techniques disclosed in subsection B. Additional details of the relative measurements are also presented below.

Typically, the method of exact fractions finds an order of interference in a cavity from the approximately known OPD and the measured fractional part of the order (e.g., the interference phase) of the different wavelengths. As an example, for two different wavelengths, the absolute (round trip) OPD can be found using the equation:

$$OPD = M\Lambda \qquad (1)$$

where $\Lambda = \lambda_1 \lambda_2 / \Delta\lambda$ is the equivalent wavelength, M is the equivalent wavelength fringe number, $\lambda_1$ and $\lambda_2$ are the heterodyne wavelengths, and $\Delta\lambda$ is the difference between the heterodyne wavelengths. In practice, because the phase error is scaled by $\Lambda$, which is typically very large, the phase measurement precision should be quite good unless many wavelengths are used with separations that minimize the sensitivity to phase error. For a fixed phase error, measurements of larger cavities can be more accurate when a larger number of wavelengths are used.

Considering just two wavelengths and starting from Eq. (1), it can be shown that $$\delta OPD = \Lambda \sqrt{\delta m^2 + M\left(\frac{\delta\lambda}{\Delta\lambda}\right)^2} \qquad (2)$$

where $\delta m$ is the uncertainty in the single wavelength fringe number and $\delta\lambda$ is the uncertainty in the wavelength. It is estimated that the heterodyne technique should provide $\delta m = 2\pi/8000$ phase uncertainty for wavelengths in a range from about 1,500 nm to about 1,600 nm. To achieve a similar fractional uncertainty from the wavelength term in Eq. (2), the uncertainty in the wavelength should be about $\delta\lambda = 0.25$ pm (about 30 MHz) for each wavelength. Equation (2) then estimates the 1-standard deviation OPD uncertainty to be 1009 nm for $\Delta\lambda = 2$ nm ($\Lambda = 1.2$ mm). This is a fractional error of 1009/1550=65%. In some embodiments, this may represent inadequate performance. Additional wavelengths (e.g., three or more, four or more, five or more wavelengths) may be preferred to reduce the fractional error.

For N>2 wavelengths the formulas for determining the appropriate equivalent wavelengths to use and the allowable wavelength and fringe number uncertainties have been previously derived, and are essentially a repeated application of Eq. (2). See, for example, P. de Groot, "Three color laser diode interferometer", *Applied Optics* 30: 3612-3616 (1991), the entire contents of which are incorporated herein by reference. The optimal wavelengths to use can be determined from the formula:

$$R = \sqrt[N-1]{\lambda_{max}/\lambda_{min}} \qquad (3)$$

where R is the ratio between adjacent equivalent wavelengths. For N=3, for example, Eq. (3) suggests using wavelengths of 1530 nm, 1530.75 nm and 1565 nm for a maximum OPD range of 3 mm. These three wavelengths combined with the measured phase and wavelength uncertainties above produce a 1-standard deviation OPD uncertainty of 12 nm (fractional error of 0.77%), which may be adequate for various applications. It may be necessary to know a priori any additional phase shifts occurring in the cavity, such as those due to phase change on reflection, and to account for these in the analysis.

Figure 19:
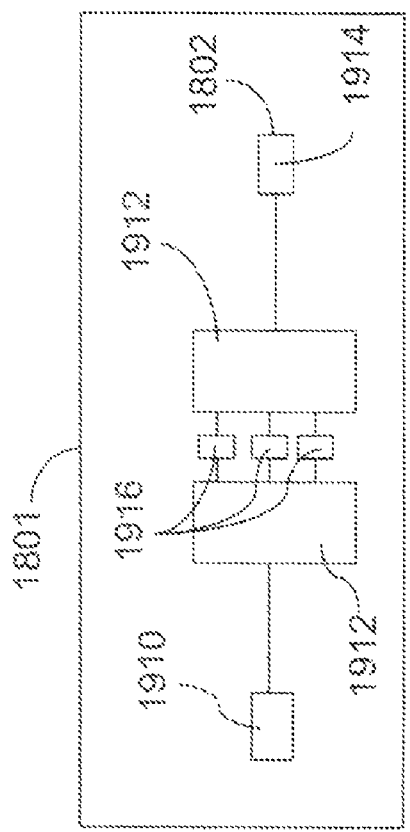
FIG. 19 is a schematic diagram of a source module.

Referring to FIG. 19, in some embodiments, source module 1801 includes a broadband light source 1910, such as an SLED or amplified spontaneous emission (ASE) source, a pair of Micro-Electro-Mechanical System (MEMS) switches 1912, a series of filters 1916 (e.g., 2.6 nm FWHM Gaussian filters), and an amplifier 1914 (e.g., SOA or EDFA). The components are coupled using single mode optical fiber. During operation, light from the source 1910 is guided via an optical fiber to one of the MEMS switches 1912, which directs the signal to one of the filters depending on the desired wavelength. The filtered signal is coupled into another optical fiber via the second MEMS switch 1912, and delivered to optical amplifier 1914. The filtered signal is amplified by optical amplifier 1914, and is subsequently delivered to the modulation module.

Source 1910 should have a sufficiently broad emission spectrum to provide enough light for all relevant wavelengths after optical amplification. For example, a SLED with a 30 nm-35 nm width can be used (e.g., a broadband source from Optiphase, Inc., Van Nuys, Calif., producing about 6 mW of output light). Other SLEDs can also be used which have even more power.

Filters 1916 are spectral filters which are coupled to MEMS switches 1912 (e.g., two MEMS 1:4 switches) to provide the appropriate wavelengths in the signal that is output to modulation module 1802. Suitable MEMS switches can be obtained from DiCon Fiber Optics, Inc. (Richmond, Calif.), for example. In certain embodiments, commercial telecom filters can be used. The temperature dependence of the center wavelength of various commercial telecom filters is about 3 pm per degree Celsius, and can be reduced to about 1 pm per degree Celsius if the filter is made epoxy-free. The temperature can be controlled such that the temperature induced wavelength variation does not produce a $2\pi$ phase change in the wavelength monitor. For telecom wavelengths, this corresponds to a wavelength variation of about 1.2 nm, or about 400° C. at 3 pm per degree Celsius. Thus, in certain embodiments, the filter section may not have to be temperature controlled.

The coherence length of the source should be small enough to minimize the influence of other cavities in the coupled cavity system on the phase measurement. In certain embodiments utilizing telecom components, it is believed that a Gaussian filter shape with a sigma parameter (e.g., the square root of the variance) greater than 1.15 nm (greater than 2.6 nm FWHM) is sufficient to keep phase error due to contamination from neighboring cavities to less than 0.3 nm for OPDs in excess of about 2 mm. Contrast at ±300 microns from the nominal cavity position may still be greater than 25%.

In embodiments, optical amplifier 1914 can be an SOA or EDFA. Optical amplifier 1914 is used to increase the output signal intensity of source module 1801. Some regions of the spectrum may have higher gain and the amplifier may increase noise in those regions, e.g., by a phenomenon known as amplified spontaneous emission (ASE). In such instances, care should be taken so that ASE regions are low enough in amplitude so that phase errors from emission at these wavelengths not too disruptive.

Figure 20B:
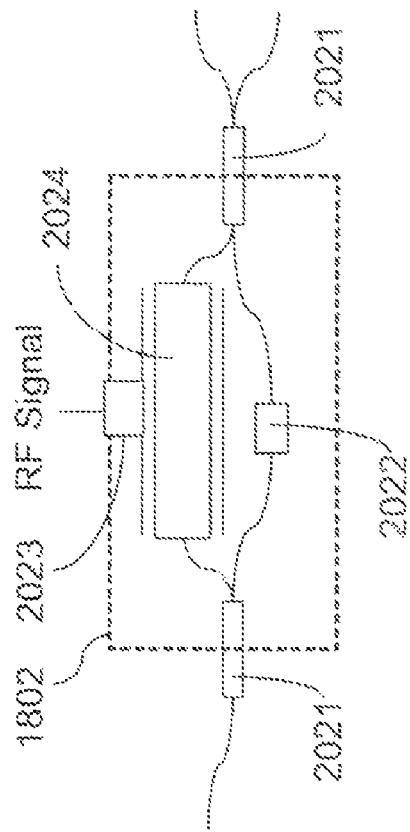
FIG. 20B is a schematic diagram of a modulation module.
Figure 20A:
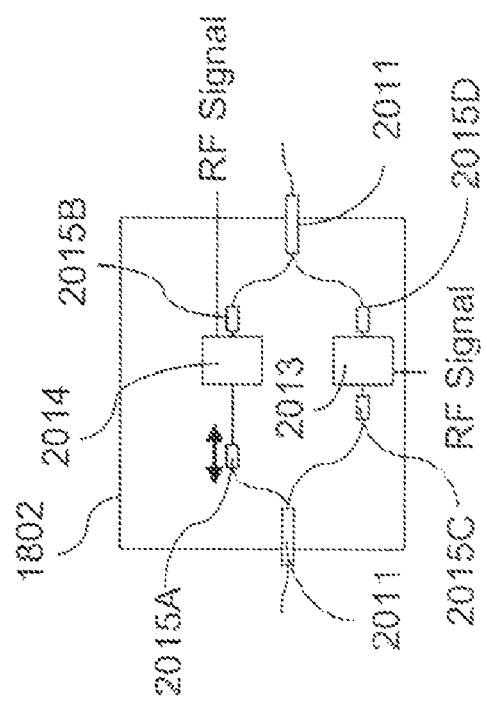
FIG. 20A is a schematic diagram of a modulation module.

Referring to FIG. 20A, in some embodiments, modulation module 1802 modulates the signal from the source module using acousto-optical modulation. Here, modulation module 1802 includes three-way couplers 2011, terminals 2015A-2015D, and AOMs 2013 and 2014. AOMs 2013 and 2014 are positioned in parallel paths, defining a coupled cavity. AOMs 2013 and 2014 are driven by radio frequency (RF) signals, offset in frequency by an amount 2f corresponding to the heterodyne frequency. Terminal 2015A is moveable, as indicated by the arrow, allowing for adjustment of the optical path length of the leg in which AOM 2014 is position.

During operation, the signal from the source module is split by a connector 2011 (e.g., a 50/50 splitter), with a portion being directed through each leg of the coupled cavity. Each portion is modulated by either AOM 2013 or AOM 2014, before being recombined by another connector 2011. The recombined signal is then delivered to the sensors via the distribution network.

Heterodyne phase detection using phase meters such as the ZMI instruments available commercially from Zygo Corporation (Middlefield, Conn.) can be used for the high speed relative measurements. The heterodyne signal is produced by AOMs 2013 and 2014, driven with radio-frequency (RF) signals whose difference is equal to the desired heterodyne frequency. In certain embodiments, the heterodyne frequency chosen (e.g., 150 kHz) should be much greater than the maximum Doppler shift (e.g., ~26 kHz at 20 mm/sec) and the sampling rate (e.g., 1 MHz) should be greater than 4 times the maximum Doppler shifted frequency (176 kHz*4=704 kHz). The heterodyne analysis techniques used can be similar to techniques used in the ZMI 4004 (available from Zygo Corporation, Middlefield, Conn.) for example. For such configurations, it is believed that phase measurement uncertainty is less than 0.1 nm.

The frequencies of the AOM RF signals may be chosen according to the type of filter selected to minimize insertion loss into the fiber. The heterodyne frequency should stay approximately constant. Another property of AOMs 2013 and 2014 is the dependence of the refracted angle on the wavelength. This property and the fiber coupler act to spectrally filter the coupled light. For AOMs that operate at 1550 nm, the chromatic dependence of the refracted angle is approximately 0.0133 mrad/nm. The fiber coupler focal length should be small enough so that negligible position shift across the fiber core occurs over the spectral range of the filters. For example, a coupler focal length of 10 mm produces less than 300 nm of lateral shift over a 2 nm wide spectrum, and does not therefore pose a significant problem.

Referring to FIG. 20B, another example of modulation module 1802 modulates the signal from the source module using electro-optical modulation. Here, the modulation module includes a phase modulator 2023, and adjustable phase delay 2022 and three-way couplers 2021 (e.g., 50/50 splitters/combiners). A first of the couplers splits the signal from the source module along two legs. Phase modulator 2023 modulates the signal directed along one leg, while the signal directed along the other leg is modified using adjustable phase delay 2022. The modulation provided by phase modulator 2023 is controlled using an RF signal. The modified signals are recombined using the second coupler, and directed to the sensors via the distribution network.

The degree of polarization of the light at each wavelength may also influence the accuracy of this technique. For example, while certain broadband sources may be substantially unpolarized with respect to its emission integrated over the entire emission spectrum, emission at single wavelengths or over narrow wavelength bands may exhibit sufficient polarization such that, where the effects are not managed, they reduce the accuracy of the system to unacceptable levels.

Accordingly, where source polarization is an issue, modifications to source module and/or modulation module can be made to manage the polarization effects. For example, polarization maintaining fibers can be used in source module 1801. Alternatively, or additionally, the modulation module can be adapted to manage polarization effects. For example, polarization maintaining fibers can be used in modulation module 1802 rather than non-polarization maintaining single mode or multimode fibers. In addition, in some embodiments, the couplers can be modified to accommodate a potential polarization dependent loss differential between the two legs of the coupled cavity. For example, while the couplers used in the configurations shown above are 50/50 couplers, the coupler used to split the signal received from the source module can be different from 50/50 (e.g., 60/40, 70/30, 80/20, 90/10) to compensate for differential loss along the two legs.

While techniques and apparatus for polarization management are described in the context of system 1800, the principle discussed can be applied to other systems where polarization management is desired.

(D) Multi-wavelength Interferometry

Figure 21:
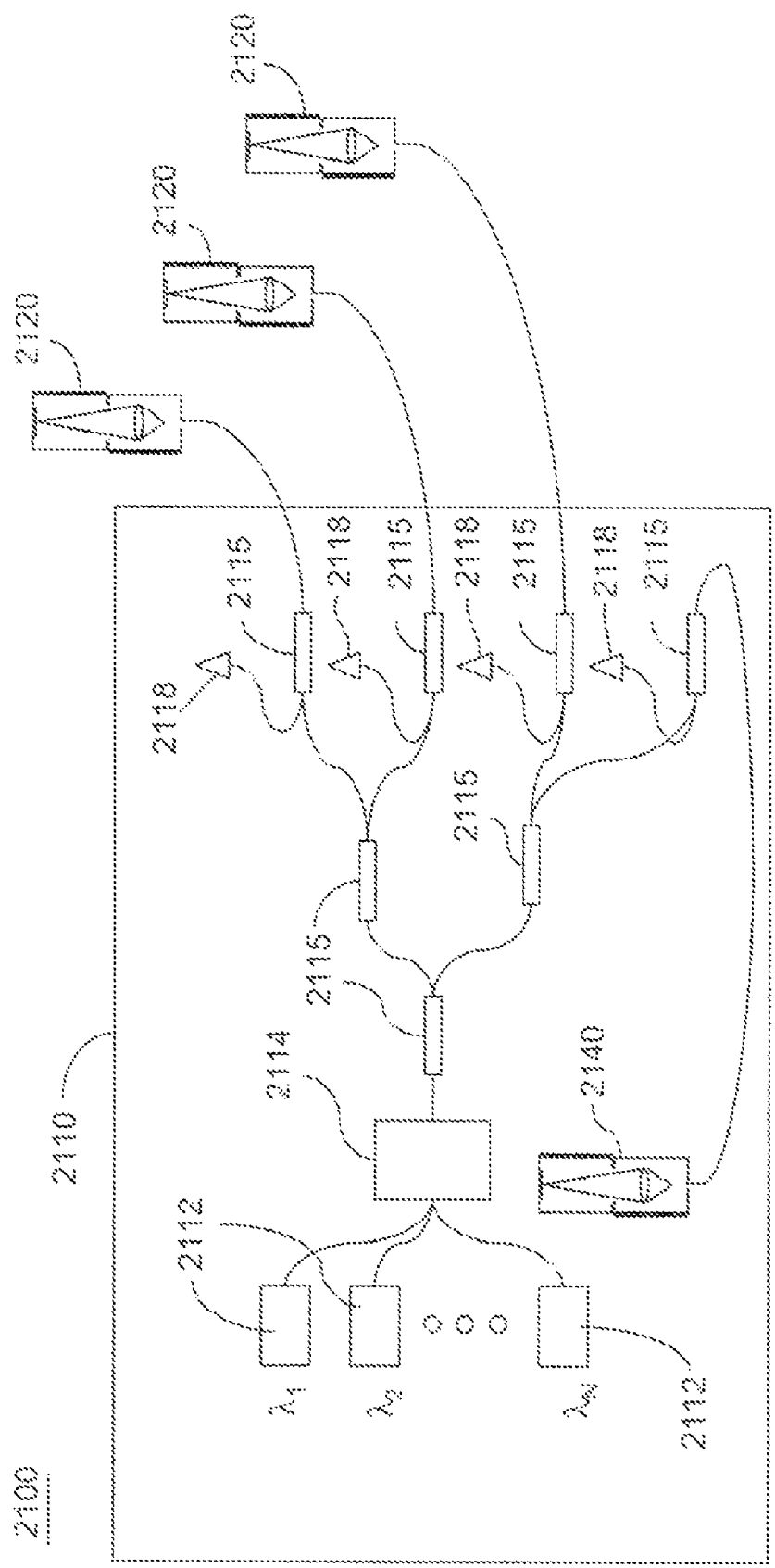
FIG. 21 is a schematic diagram of a sensor system.

Multi-wavelength interferometry uses a large number of discrete wavelengths to calculate the absolute cavity OPD by fitting the results of interference intensity measurements to a physical model of the system. Referring to FIG. 21, an exemplary system 2100 for implementing this technique includes a SD unit 2110 and sensors 2120. SD unit 2110 includes N>2 substantially monochromatic light sources 2112, such as distributed feedback lasers. Each light source is configured to provide light at a different wavelength, $\lambda_i$, where i=1 ... N. SD unit 2110 also includes an add/drop multiplexer 2114, such as a multiplexer used in WDM applications. During operation, multiplexer 2114 is used to perform rapid wavelength selection of the signals from light sources 2112. SD unit 2110 also includes a distribution network including optical fibers and couplers 2115 which deliver signals from WDM 2110 to sensors 2120, detectors 2118, and reference cavity 2140.

In embodiments where the wavelengths and intensities of the individual wavelengths, $\lambda_i$, are known, a least-squares fit (LSF) can be applied to the intensity data with the absolute phase as a free parameter. The phase dependence on intensity can be non-linear, so that general minimization methods (such as Levenberg-Marquardt) are used. Alternatively, or additionally, the system can be linearized and iterated.

In order to accommodate reasonable uncertainties in both wavelength and intensity, the method can use a large number of wavelengths. However, to impose limits on both cost and measurement time, the number of wavelengths can be limited, e.g., the number of wavelengths can be limited to 8. In some embodiments, however, eight wavelengths may be insufficient to produce merit functions with sufficient discriminatory power to unambiguously arrive at the correct solution for the OPD range of interest. Even with extremely small uncertainties in wavelength (e.g., about 1 MHz) and intensity (e.g., about 0.01%), the merit function differences between the true fringe order and a neighbor may be too small to reliably distinguish (e.g., typically less than 0.01%). Many more wavelengths can be used to make the method practical (e.g., N can be 10 or more, 15 or more, 20 or more, 30 or more). Furthermore, in some embodiments, certain additional phase shifts that occur in the sensor cavities may be known a priori, such as those due to phase change on reflection, in order to account for these in the analysis.

(E) Swept Wavelength Interferometry

Figure 22A:
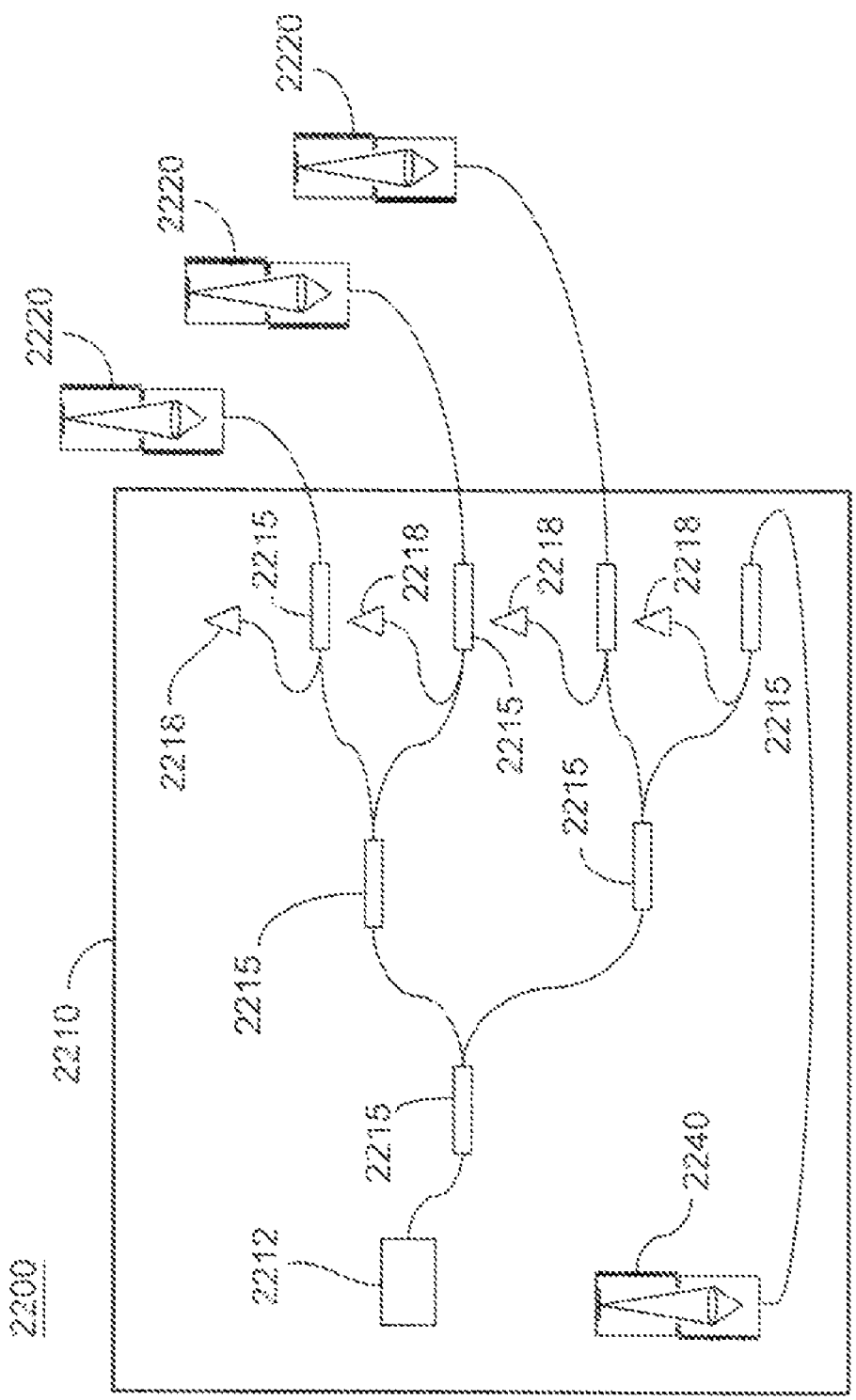
FIG. 22A is a schematic diagram of a sensor system

In some embodiments, broadly tunable source radiation can be used both to calculate the absolute OPD and to rapidly track the OPD variation in the sensors. An example of a such a system is shown in FIG. 22A. System 2200 includes an SD unit 2210 and sensors 2220. SD unit 2210 includes a tunable source 2212, such as a tunable DFB laser, couplers 2215, detectors 2218, and reference cavity 2240. Along with a number of optical fibers, couplers 2215 form a distribution network which deliver signals from source 2212 to sensors 2220, detectors 2218, and reference cavity 2240.

The system can operate in two modes. In one mode, the wavelength is tuned over a large enough range to resolve the fringe order, and in the other mode, the wavelength is tuned rapidly over a range sufficiently large to calculate the cavity phase. In both modes, the tuning range depends on the sensor cavity OPDs.

In the first (absolute) mode, the OPD is determined by a measurement of the fundamental interference frequency generated during wavelength tuning, and the fundamental is measured through a spectral analysis of the interference pattern. Ultimately the OPD determination should be good enough to resolve a fringe order, so good metrology dictates that the OPD uncertainty should be less than 20% of half a fringe (e.g., about 80 nm for a system operating at about 1550 nm). The uncertainty in the determination of the fundamental can depend sensitively on a large number of parameters including contrast, wavelength and intensity uncertainty, the analysis method, a number of samples, etc. In some embodiments, the source has a tuning range of about 3 THz or more. Systems with a 3 THz tuning range include external cavity laser sources and are available, for example, from New Focus (San Jose, Calif.) and Santec (Japan). Tuning ranges for typical DFB systems are about 500 GHz, for example.

In a high-speed relative measurement, source 2212 is rapidly tuned through a smaller wavelength range while the intensity is sampled and then a special phase shifting interferometry (PSI) algorithm is applied to the intensity time history.

In some embodiments, the source is tuned used a sinusoidal current modulation, which can be performed rapidly enough. For a maximum wavelength change of about 30 GHz, the minimum cavity gap should be about 5 mm to achieve at least one cycle of phase variation. In certain embodiments, the minimum sensor cavity gap is about 10 mm or more to provide for more phase shift range and to account for tuning variability between lasers. In embodiments using sinusoidal current modulation, the output intensity of the source may change as a function of current and/or the accompanying phase shift may be non-linear. To address these issues, the intensity variation can be measured and compensated by the measurement system.

A nonlinear phase shift may be compensated, for example, by use of a PSI algorithm on intensity data near the zero-crossing point where the tuning is quasi-linear and/or use of an algorithm constructed specifically for the sinusoidal phase modulation that accounts for the non-linear phase shift. For sinusoidal phase modulation, the nonlinearities are odd harmonics of the fundamental frequency. PSI algorithms can be used to determine phase information from the data. For example, a 13-frame PSI algorithm can be employed, and uses about 70% of the sine amplitude. As the cavity OPD changes, the phase shift increment will change, a phenomenon known as a first order phase shifter miscalibration. The 13-frame algorithm is insensitive to first order phase shifter miscalibration. However, direct phase errors can occur if the zero-crossing measurement drifts, for example, from a DC bias. This error source may require careful temperature compensation in the electronics.

Figure 22B:
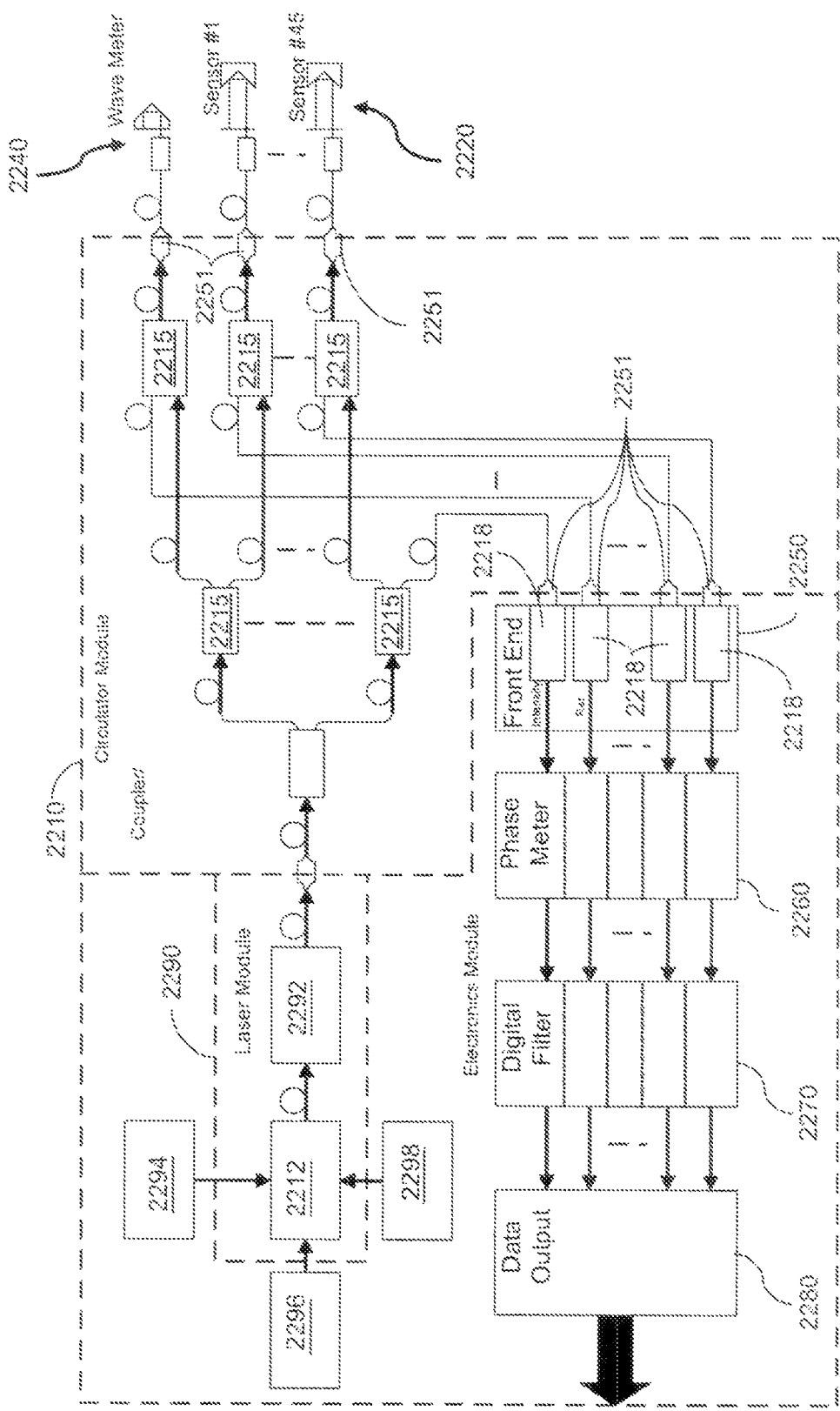
FIG. 22B is a schematic diagram of the sensor system shown in FIG. 22A including electronic components.

Referring to FIG. 22B, in addition to the components shown in FIG. 22A, system 2200 includes various electronic components for processing the optical signals generated by the sensors and providing control signals to the light source and servo system used to manipulate the PO assembly being monitored. The electronics module in system 2200 includes a front end 2250 that houses detectors 2218. Connectors 2251 couple optical fibers carrying signals from sensors 2220 and wavelength monitor 2240 to detectors 2218. The front end 2250 is coupled to a phase meter 2260 which extracts phase information from interference signals generated by detectors 2218 in response to the optical signals. Phase meter is coupled to a digital filter 2270, which filters the phase information before directing it to a data output module 2280.

The electronics module also includes several components that are coupled to source 2212, which is shown connected to an optical isolator 2292. In particular, the electronics module includes a thermal controller 2294, a modulation generator 2296, and a driver 2298. Thermal controller 2294 stabilizes the temperature of the source, reducing any wavelength drift associated with thermal variations. Modulation generator 2296 modulates the output wavelength of the source as desired according to the method used to operate the sensors. Driver 2298 supplies power to the source.

Figure 22C:
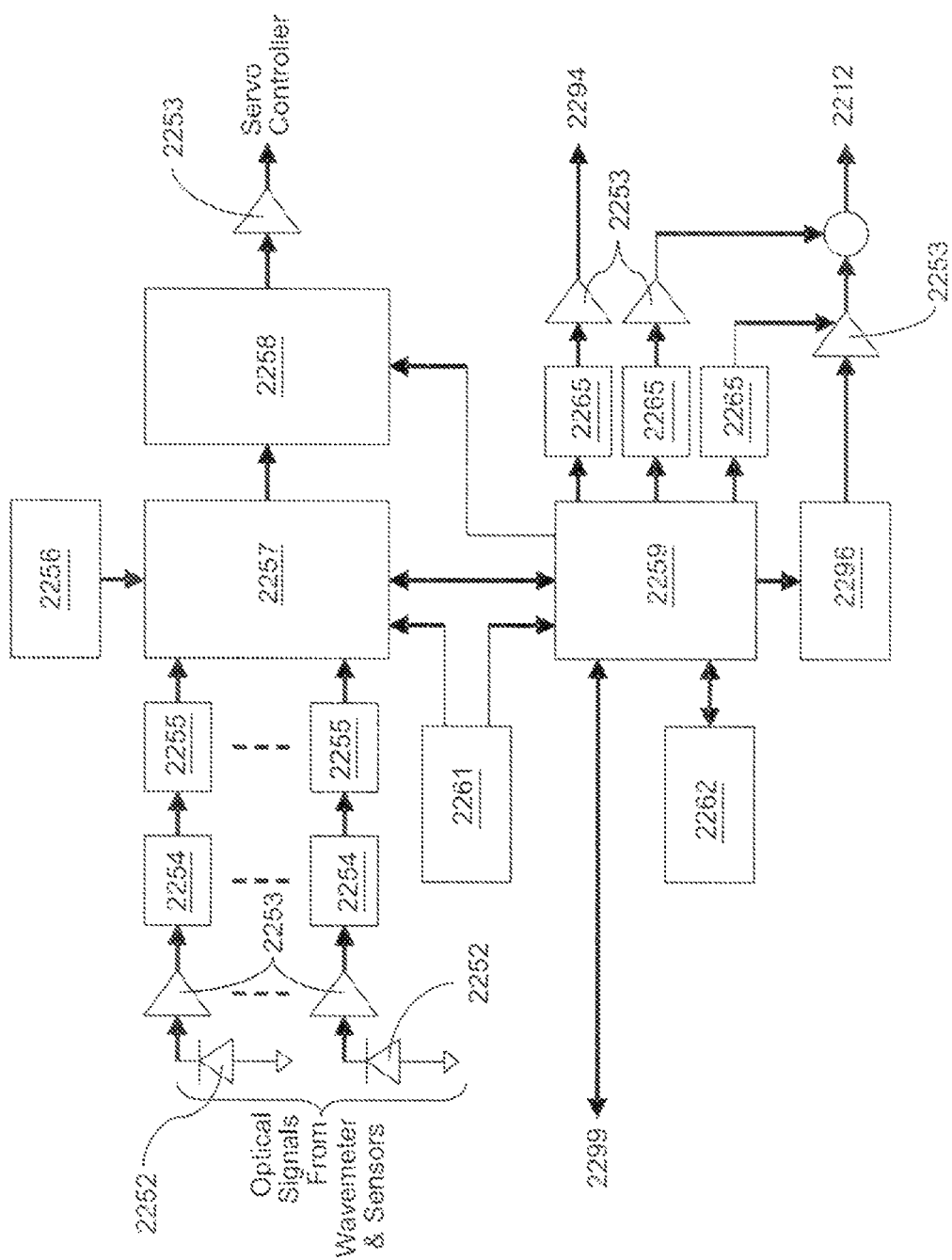
FIG. 22C is a circuit diagram of electronic components shown in FIG. 22B.

Referring to FIG. 22C, in certain embodiments, the electronics module includes a digital signal processor (DSP) 2257 which receives interference signal from each input channel (e.g., from each sensor detector and the wavelength monitor detector). Each channel includes a diode 2252, an operational amplifier 2253, a low pass filter 2254, and an analogue-to-digital converter (ADC) 2255, which reduce noise in the interference signal and format it for processing by DSP 2257. DSP 2257 is also in communication with a program memory 2256, a support circuit 2261, a field programmable gate array (FPGA) output driver 2258, and a main computation unit 2259.

FPGA output driver 2258 also receives signals from main computation unit 2259 and provides drive signals to the servo controller.

Main computation unit 2259 is connected to a non-volatile memory 2262, and modulation generator 2296, discussed above. Main computation unit 2259 provides control signals to thermal controller 2294 and source 2212, also discussed above. The output channels from main computation unit 2259 to thermal controller 2294 and source 2212 include digital-to-analogue (DAC) converters 2265.

Main computation unit 2259 also includes a channel to an interface 2299, such as a USB interface or a RS 232 interface.

While the electronics module described above is discussed in reference to sensor system 2200, in general, the electronics module can be adapted for used in other systems as well.

Additional Components

A number of the embodiments discussed above include additional optical components. For example, certain embodiments include a reference cavity or a wavelength monitor. In general, sensor systems can include a variety of additional components in order to provide additional information regarding, for example, the system environment and/or the stability of the light source. For example, in certain embodiments, sensor systems can include a refractometer which provides information regarding changes in the refractivity of the atmosphere that may affect the accuracy of the sensors. Alternatively, or additionally, sensor systems can include an intensity monitor, e.g., to provide information regarding changes in the intensity of the light source.

As mentioned above, in certain embodiments, a sensor system can include a reference cavity. For example, a reference cavity can be used to compensate for variations in the OPD changes that may occur in a coupled cavity used to provide a heterodyne signal. During operation, simultaneous reference cavity phase measurements can be subtracted from the test cavity phase measurements to eliminate heterodyne cavity OPD variations.

Regarding wavelength monitors, in general, the free spectral range of the wavelength monitor should encompass the maximum wavelength variation expected during operation of the system. Wavelength variation can occur, for example, due to the filter temperature dependence. The wavelength monitor should be able to determine the mean wavelength with an uncertainty such that its contribution to Eq. (2) is comparable to the phase uncertainty. This can be accomplished using a wavelength monitor based on an interferometer similar to the sensors themselves, but with a fixed OPD. If the OPD is made to be the same as the nominal OPD of the sensors, then it can double as the reference cavity for calibration purposes.

Figure 23:
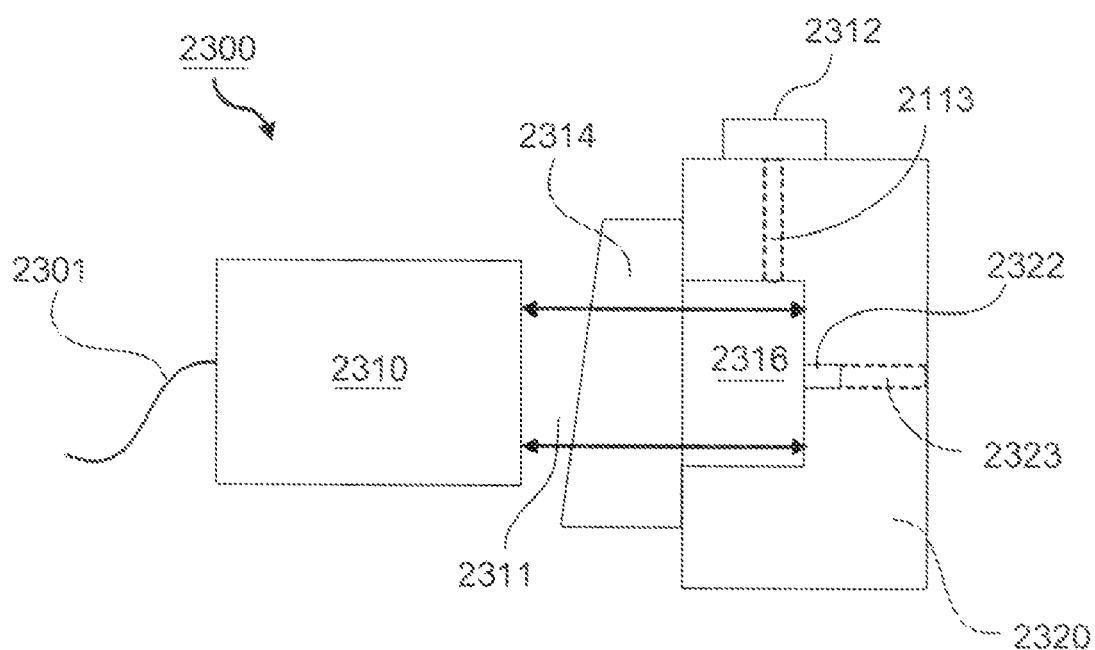
FIG. 23 is a schematic diagram of a wavelength monitor.

Referring to FIG. 23, an embodiment of a wavelength monitor 2300 includes a block 2320 of material with appropriate thermal properties (e.g., a Zerodur block) with a hollow bore 2316 of having a depth corresponding to the desired gap for the interferometer. One side of the block is polished to define the mating surface for a reference optic 2314 that is optically contacted to the block. Another concentric smaller bore 2323 accepts a small retroreflector 2322 and is sealed. With both center bores plugged, the cavity is evacuated through a third perpendicular bore 2313 and sealed with a plug 2312. The cavity is thus evacuated, air-tight, thermally stable and relatively easy to align to a fiber collimator 2310 which delivers radiation from an optical fiber 2301. In certain embodiments, the temperature of the wavelength monitor is actively controlled. For example, in some embodiments, the temperature of the wavelength monitor is stabilized to within 1° C.

Wavelength monitor 2300 can double as a reference cavity and/or as a refractometer. Because the physical gap in wavelength monitor 2300 is long term stable, the design can also be used as a refractometer by permitting the local atmosphere to enter the cavity and assuming that changes in the OPD are due to atmospheric conditions alone. This can increase the manufacturing volume and lowers the final cost of the monitor.

Applications

In general, as discussed, the sensor systems described above are used to monitor the position of a variety of different optical components in a projection objective assembly. Optical components include refractive optical components, reflective optical components, and/or diffractive optical components. For example, in a catoptric PO assembly, sensor systems can be used to monitor the position of the lenses, which are an example of refractive components, in the assembly. In dioptric PO assembly assemblies, sensor systems can be used to monitor the position of mirrors, which are an example of reflective components, in the PO assembly. Furthermore, sensor systems can be used to monitor the position of other components, such as polarizers, gratings, etc. Moreover, sensor systems can be used to monitor the position of optical components in optical systems in addition to PO assembly assemblies. For example, in a photolithography tool, sensor systems may be used to monitor the position of one or more components in an illumination system alternatively or additionally to components in the PO assembly.

In photolithographic applications, projection objective assemblies are used to image a reticle pattern onto a resist layer on a wafer in a lithography tool. Lithography tools are especially useful in lithography applications used in fabricating large scale integrated circuits such as computer chips, LCD panels, and the like. Lithography is the key technology driver for the semiconductor manufacturing industry.

The function of a lithography tool is to direct spatially patterned radiation onto a photoresist-coated wafer. The process involves determining which location of the wafer is to receive the radiation (alignment) and applying the radiation to the photoresist at that location (exposure) via a projection objective. Stability of the projection objective is important for repeatable imaging of the reticle pattern onto wafer resist.

To properly position the wafer, the wafer includes alignment marks on the wafer that can be measured by dedicated sensors. The measured positions of the alignment marks define the location of the wafer within the tool and relative to the projection objective. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates the patterned reticle, which scatters the radiation to produce the spatially patterned radiation. The reticle is also referred to as a mask, and these terms are used interchangeably below. In the case of reduction lithography, projection objective collects the scattered radiation and forms a reduced image of the reticle pattern. The radiation initiates photo-chemical processes in the resist that convert the radiation pattern into a latent image within the resist.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, the illumination system has a projection objective for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

As discussed above, sensor systems are used to monitor the position of components of the projection objective. While the sensors are mounted with the components in the projection objective, the SD unit can be located within the tool or at some location remote from the tool.

Figure 24:
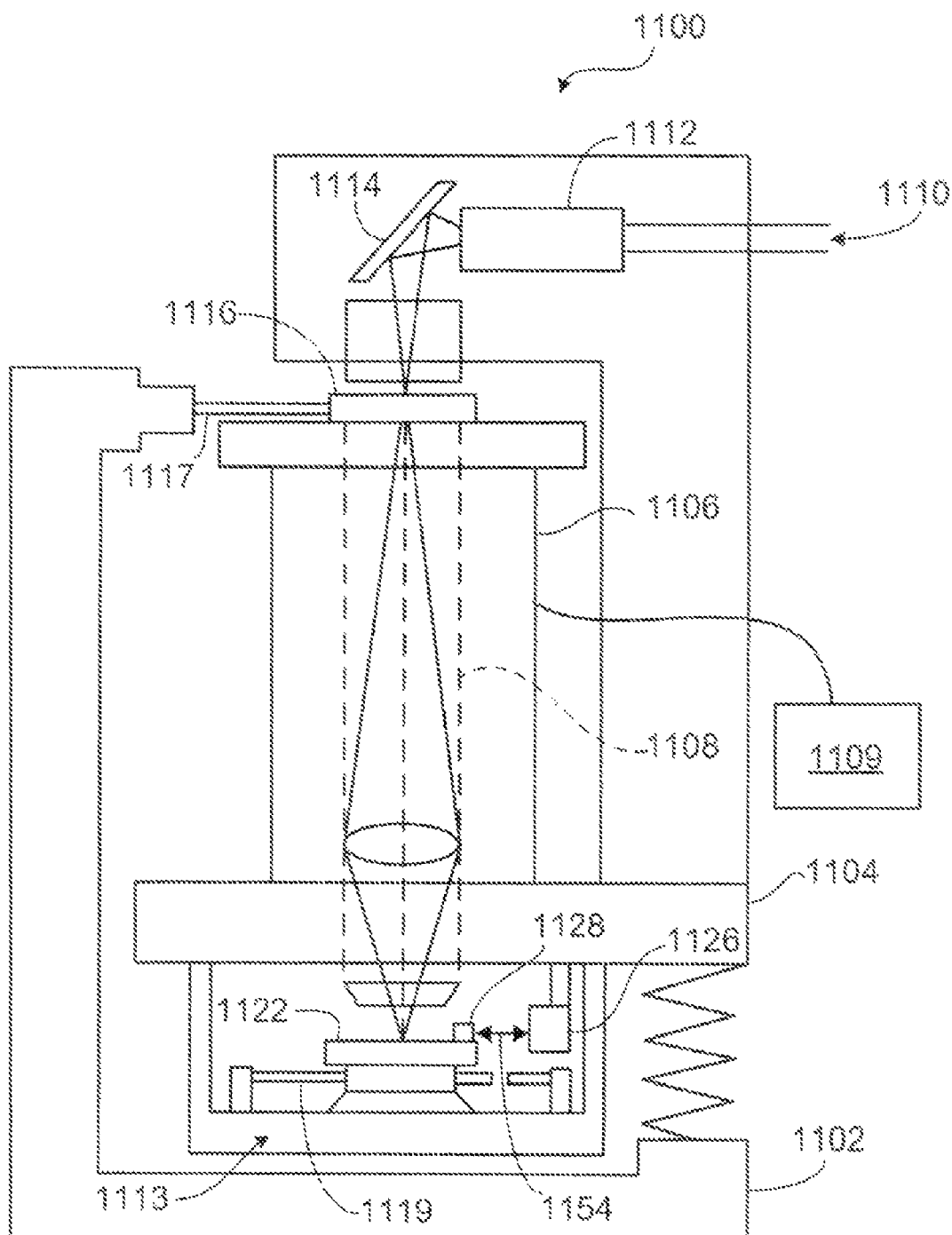
FIG. 24 is a schematic diagram of a photolithography tool.

Another example of a lithography tool 1100 is shown in FIG. 24. An interferometry system 1126 is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a projection objective housing 1106 atop of which is mounted a reticle or mask stage 1116, which is used to support a reticle or mask. An SD unit 1109 is connected via one or more optical fibers to sensors mounted within housing 1106. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1134 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

Figure 25A:
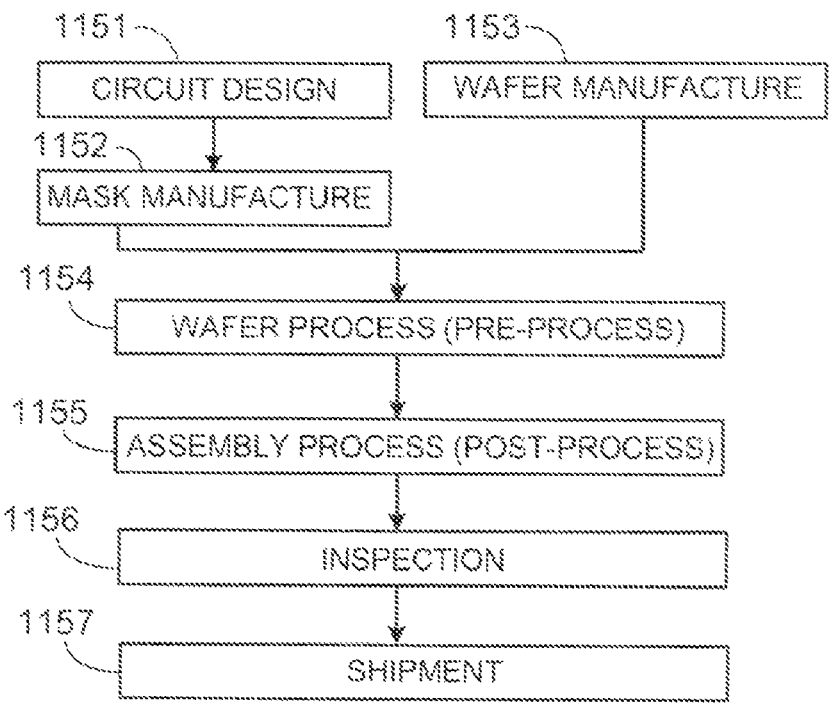
FIG. 25A and FIG. 25B are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 25A and 25B. FIG. 25A is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 25B:
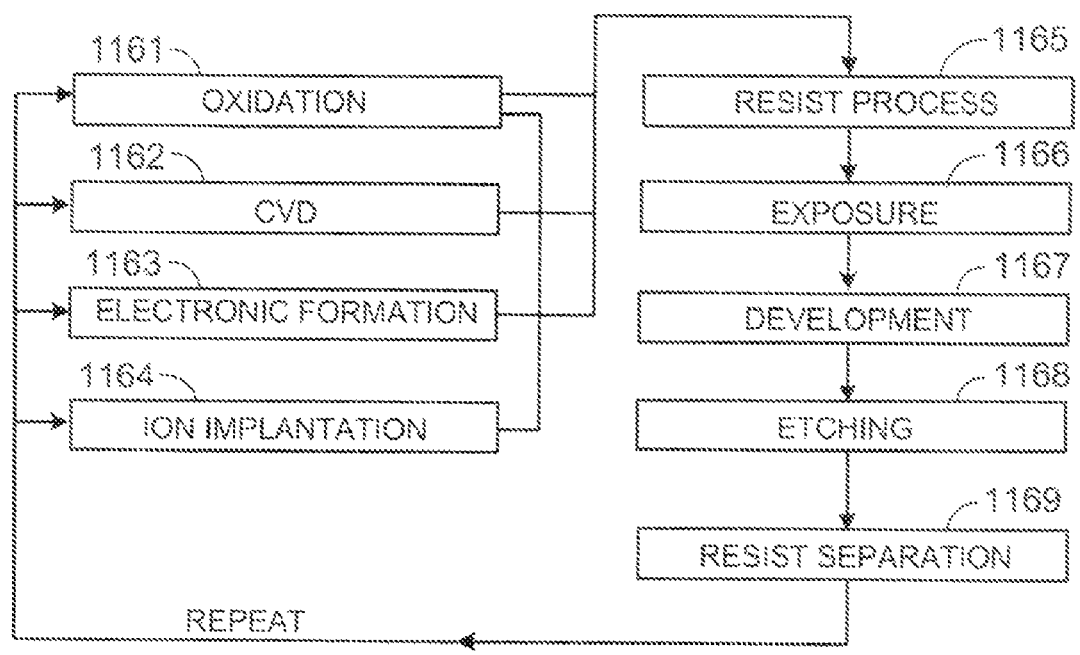

FIG. 25B is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

Figure 26:
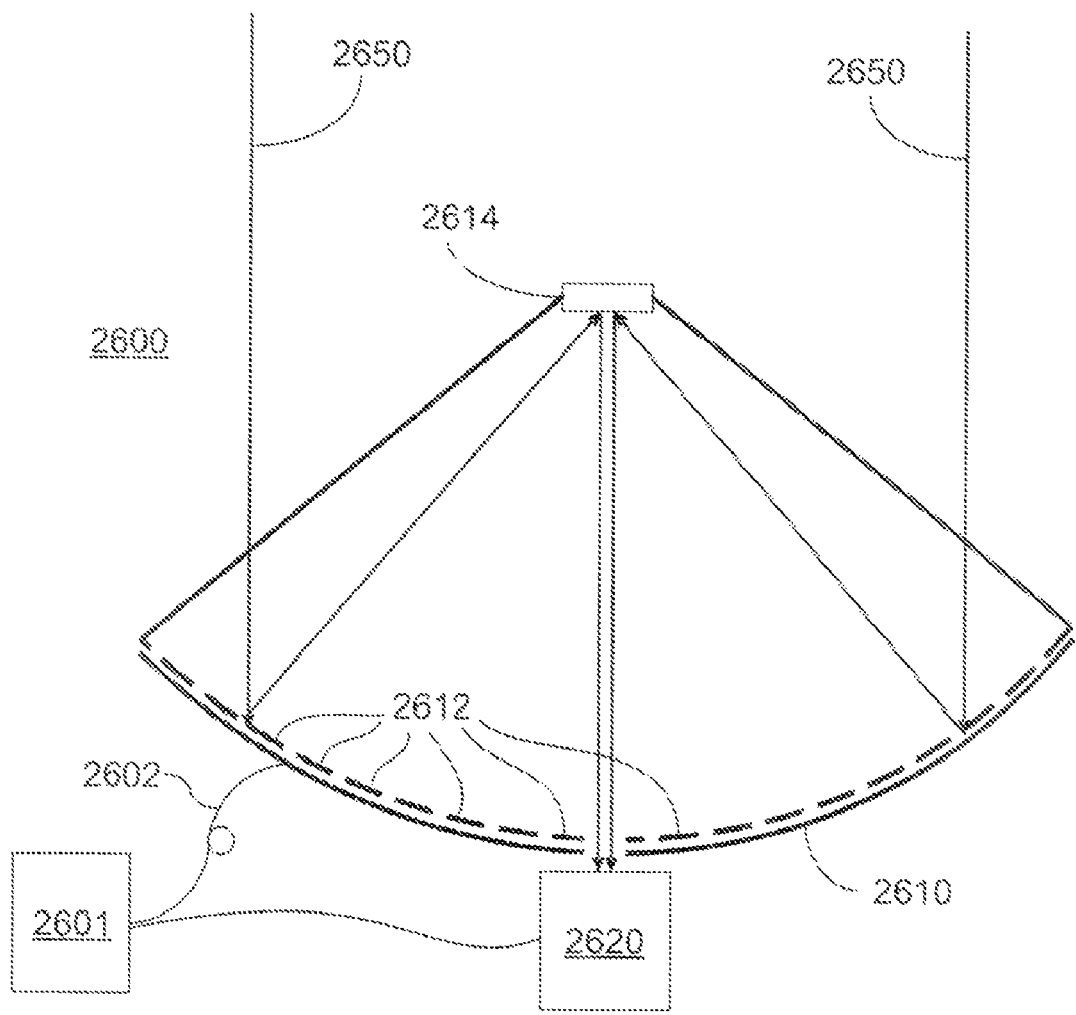
FIG. 26 is a schematic diagram of a telescope that includes adaptive optics and a sensor system.

Another example of using sensor systems in an optical imaging system is in a system that utilizes adaptive optics to compensate for imaging defects that may occur. For example, referring to FIG. 26, in some embodiments, a sensor system 2601 is used to monitor the position of a number of minors 2612 in a telescope 2600. Mirrors 2612 are mounted on a base 2610 and arranged to provide a large, focusing element that focuses radiation rays 2650 to a second focusing optic 2614. Second focusing optic 2614 focuses the rays onto a detector/controller system 2620, which records information about the imaged radiation. Telescope 2600 also includes a sensor system with an SD unit 2601, a fiber network 2602, and sensors that are mounted on base 2610 and minors 2612. During operation, the sensors monitor one or more degrees of freedom of the minors which SD unit 2601 communicates to detector/controller system 2620. Based on the information from the SD unit, the detector/controller system repositions one or more of the mirrors using embedded actuators in order to reduce imaging aberrations in the system, e.g., due to atmospheric fluctuations that may occur in the path of rays 2650.

More generally, sensor systems can be used in applications other than to monitor components in PO assemblies. In general, the sensor systems discussed herein can be used to monitor the position of one object with respect to another in a variety of systems, particularly where a large number of measurement channels are desired.

Figure 27:
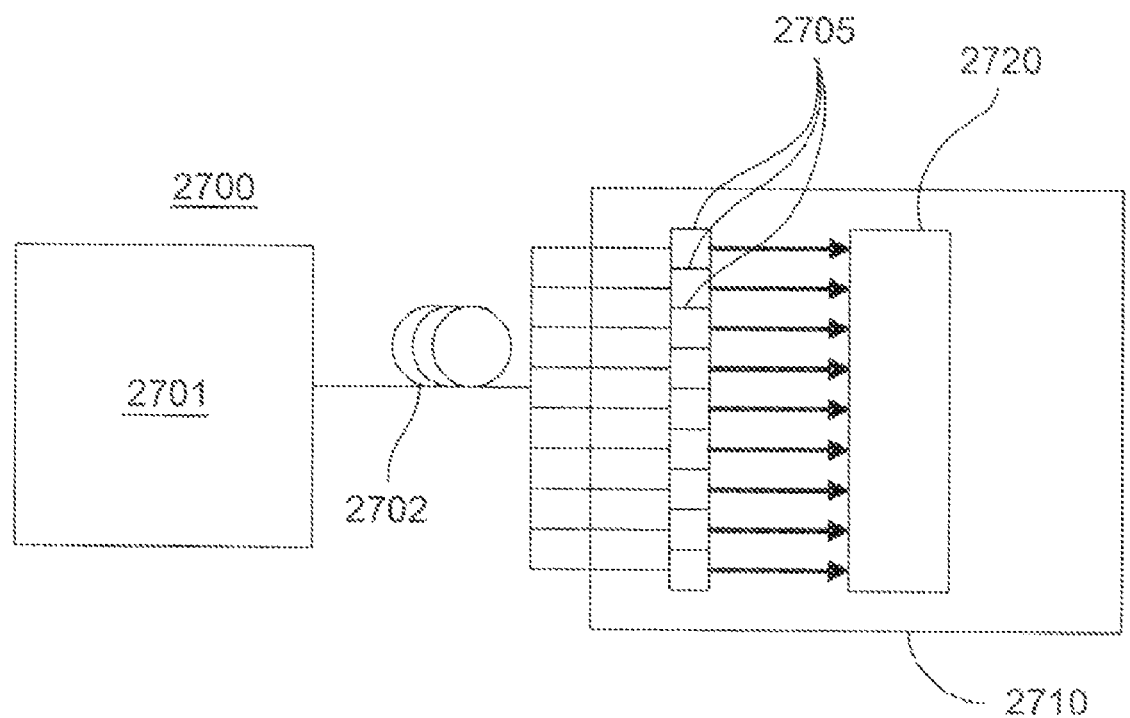
FIG. 27 is a schematic diagram of an apparatus that includes a sensor system.

Referring to FIG. 27, a sensor system monitors multiple degrees of freedom of a first object 2720 with respect to a second object 2710 in a system 2700. The sensor system includes an SD unit 2701, sensors 2705 and a fiber network that connects SD unit 2701 to sensors 2705.

Although the schematic in FIG. 27 shows the sensor system configured to monitor degrees of freedom of a single object with respect to another object, embodiments can be configured to monitor degrees of freedom of more than one object.

System 2700 can be an optical system, such as the embodiments described above, or other types of system where components of the system are moveable with respect to each other and relative motion between components effects the system's performance. Examples of systems include manufacturing systems that demand precise positioning of a part relative to other parts or relative to one or more tools in the manufacturing system.

A number of embodiments of the invention have been described. Nevertheless, it will be understood that various modifications may be made without departing from the spirit and scope of the invention. Accordingly, other embodiments are in the following claims.

What is claimed is:

1. A system for monitoring a position of one or more optical elements in a projection objective (PO), the system comprising:
    a plurality of sensors each configured to receive input light and to form output light, each sensor comprising a first sensor optic and a second sensor optic, the first sensor optic of at least one of the sensors being affixed to a first PO optical element and the second sensor optic of the at least one sensor being affixed to a support element that positions the first PO optical element within the PO, the first and second sensor optics being configured introduce a first optical path length difference (OPD) between two components of the input light to form the output light, the first OPD being related to the position of the first PO optical element with respect to the support element;
    a plurality of detectors configured to detect the output light from the sensors;
    a plurality of optical fibers configured to direct the input light to the sensors and to direct the output light from the sensors to the detectors; and
    an electronic controller in communication with the plurality of detectors, the electronic controller being configured to determine information about the position of the first PO optical element relative to the support element based on the detected output light from the at least one sensor.

2. The system of claim 1, further comprising a light source module configured to provide light to the sensors.

3. The system of claim 2, wherein the light provided by the light source module is low coherence light.

4. The system of claim 2, wherein the light source module comprises a broadband light source.

5. The system of claim 2, further comprising a modulation apparatus in the optical path between the light source module and the detectors, the modulation apparatus being configured to receive light from the light source module, introduce a second OPD between a first portion and a second portion of the received light where the second OPD is greater than a coherence length of the light source module, modulate a phase between the first and second portions, and combine first and second portions to provide the input light.

6. The system of claim 5, wherein a difference between the first OPD and the second OPD is less than the coherence length of the light source module.

7. The system of claim 2, further comprising a modulation apparatus in the optical path between the light source module and the detectors, the modulation apparatus being configured to receive light from the light source module, direct a first portion and a second portion of the received light along a first path and a second path, respectively, the first path being different from the second path, modulate a phase between the first and second portions, and combine first and second portions to provide the input light.

8. The system of claim 7, wherein the two components of the input light each comprise light directed along the first path and light directed along the second path, the modulation apparatus being configured so that, in the output light, a portion of a first of the two components of the input light directed along the first path by the modulation apparatus interferes with a portion of a second of the two components of the input light directed by the modulation apparatus along the second path.

9. The system of claim 2, further comprising a reference cavity configured to receive reference input light from the light source module and to direct reference output light to a corresponding detector.

10. The system of claim 9, wherein the electronic controller is configured to determine information about a refractivity of a gas in the reference cavity based on the reference output light.

11. The system of claim 9, wherein the electronic controller is configured to determine information about a wavelength of the input light based on the reference output light.

12. The system of claim 2, wherein the light source module and detectors are positioned remote from the PO.

13. The system of claim 1, wherein a first of the two components of the input light reflects from the first sensor optic but not the second sensor optic.

14. The system of claim 1, herein the first sensor optic is a mirror.

15. The system of claim 1, wherein the first sensor optic is a retroreflector.

16. The system of claim 1, wherein each sensor comprises a lens configured to receive input light from a corresponding one of the optical fibers.

17. The system of claim 16, wherein the lens is configured to direct output light to the corresponding optical fiber.

18. The system of claim 16, wherein the lens is a Graded-index material (GRIN) lens.

19. The system of claim 1, wherein each of the sensors is coupled to a corresponding optical fiber configured to both deliver the input light to the sensor and collect the output light from the sensor.

20. The system of claim 1, wherein the PO assembly comprises one or more actuators coupled to the first PO optical element, where the one or more actuators are in communication with the electronic controller and during operation the electronic controller causes the one or more actuators to adjust the position of the first PO optical element based on the information.

21. The system of claim 1, wherein the information comprises an absolute distance between the first PO optical element and the support element.

22. The system of claim 1, wherein the information comprises a variation in a distance between the PO optical element and the support element.

23. The system of claim 1, wherein the PO optical element is affixed to the support element via a frame that is rigidly attached to the PO optical element, and the first sensor optic is attached to the frame.

24. The system of claim 1, wherein multiple of the sensors are configured to provide output light comprising information about a corresponding degree of freedom of the same PO optical element.

25. The system of claim 1, wherein the plurality of sensors are configured to provide output light comprising information about a position of more than one PO optical element.

26. The system of claim 1, wherein the first OPD is a non-zero OPD.

27. A method for monitoring a position of one or more optical elements in a projection objective (PO), the method comprising:
   directing input light via a plurality of optical fibers to a plurality of sensors, where each sensor introduces a first optical path difference (OPD) between two components of the input light to form output light, wherein at least one of the components contacts a first sensor optic and at least one of the components contacts a second sensor optic, the first sensor optic being affixed to a first PO optical element and the second sensor optic being affixed to a support element that positions the first PO optical element within the PO, the first OPD being related to the position of the first PO with respect to the support element;
   detecting the output light from the sensors; and
   determining information about the position of the first PO optical element relative to the support element based on the detected output light from at least one of the sensors.

28. A projection objective (PO) assembly for a lithography tool, comprising:
   a plurality of PO optical elements arranged within the PO assembly which, during operation, images a pattern on a reticle onto a resist layer on a substrate; and
   a sensor sub-system comprising:
   a plurality of sensors, each configured to receive input light and to form output light from the input light, the output light from each sensor comprising interferometric information related to a position of a corresponding PO optical element within the PO assembly;
   a plurality of detectors configured to detect the output light from a corresponding sensor;
   a plurality of optical fibers configured to direct the input light to the sensors and direct the output light from the sensors to the detectors; and
   an electronic controller in communication with the plurality of detectors, the electronic controller being configured to determine information about the position of the corresponding optical elements based on the detected output light from the sensors.

* * * * *

UNITED STATES PATENT AND TRADEMARK OFFICE
CERTIFICATE OF CORRECTION

| | | |
|---|---|---|
| PATENT NO. | : 7,826,064 B2 | Page 1 of 1 |
| APPLICATION NO. | : 12/635932 | |
| DATED | : November 2, 2010 | |
| INVENTOR(S) | : Peter de Groot et al. | |

It is certified that error appears in the above-identified patent and that said Letters Patent is hereby corrected as shown below:

On the title page, column 2, Abstract, line 10, before "introduce" insert --to-.

Column 28, line 20, in claim 1 after "configured" insert --to--.

Column 29, line 22, in claim 14 delete "herein" insert --wherein--.

Signed and Sealed this
Fifteenth Day of February, 2011

David J. Kappos
*Director of the United States Patent and Trademark Office*